(12) United States Patent
Motwani

(10) Patent No.: US 8,091,009 B2
(45) Date of Patent: Jan. 3, 2012

(54) SYMBOL BY SYMBOL MAP DETECTION FOR SIGNALS CORRUPTED BY COLORED AND/OR SIGNAL DEPENDENT NOISE

(75) Inventor: Ravi Motwani, Longmont, CO (US)

(73) Assignee: Broadcom Corporation, Irvine, CA (US)

(*) Notice: Subject to any disclaimer, the term of this patent is extended or adjusted under 35 U.S.C. 154(b) by 975 days.

(21) Appl. No.: 11/438,464

(22) Filed: May 22, 2006

(65) Prior Publication Data

US 2007/0226599 A1 Sep. 27, 2007

Related U.S. Application Data

(60) Provisional application No. 60/785,243, filed on Mar. 23, 2006.

(51) Int. Cl.
*G11B 20/18* (2006.01)
(52) U.S. Cl. .................................... 714/769; 714/780
(58) Field of Classification Search .................. 714/752, 714/755, 780, 792, 769
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 6,757,122 B1* | 6/2004 | Kuznetsov et al. | 360/53 |
| 6,798,852 B2* | 9/2004 | Khayrallah et al. | 714/794 |
| 6,831,574 B1* | 12/2004 | Mills et al. | 341/50 |
| 6,901,119 B2* | 5/2005 | Cideciyan et al. | 375/341 |
| 6,968,021 B1* | 11/2005 | White et al. | 375/340 |

(Continued)

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |

OTHER PUBLICATIONS

Kavcic, "Soft Output Detector for Channels with Intersymbol Interference and Markov Noise Memory", GLOBECOM '99, Global Telecommunications Conference, 1999, pp. 728-732.*

(Continued)

*Primary Examiner* — Stephen Baker
(74) *Attorney, Agent, or Firm* — Garlick Harrison & Markison; Shayne X. Short

(57) ABSTRACT

Symbol by symbol MAP detection for signals corrupted by colored and/or signal dependent noise. A novel means is presented for recursive calculation of forward metrics ($\alpha$), backward metrics ($\beta$), and corresponding soft information (e.g., which can be provided as LLRs (log likelihood ratios)) within communication systems in which a trellis can be employed to perform demodulation of a received signal sequence. For signals that have been corrupted by colored and/or signal dependent noise, this means provides for the ability to perform novel soft information calculation for subsequent use in iterative decoding processing. Many types of communication channels can benefit from this novel means of detection including communication channels within hard disk drives (HDDs).

20 Claims, 15 Drawing Sheets

U.S. PATENT DOCUMENTS

| | | | |
|---|---|---|---|
| 6,976,203 B2 * | 12/2005 | Kurtas et al. | 714/755 |
| 7,000,168 B2 * | 2/2006 | Kurtas et al. | 714/755 |
| 7,031,090 B2 * | 4/2006 | Ichihara et al. | 360/65 |
| 7,058,878 B2 * | 6/2006 | Kanaoka et al. | 714/794 |
| 7,154,936 B2 * | 12/2006 | Bjerke et al. | 375/148 |
| 7,197,691 B2 * | 3/2007 | Beerel et al. | 714/795 |
| 7,200,798 B2 * | 4/2007 | Bickerstaff | 714/794 |
| 7,205,912 B1 * | 4/2007 | Yang et al. | 341/59 |
| 7,219,295 B2 * | 5/2007 | Yamada | 714/758 |
| 7,237,173 B2 * | 6/2007 | Morita et al. | 714/755 |
| 7,237,181 B2 * | 6/2007 | Richardson | 714/780 |
| 7,340,003 B1 * | 3/2008 | Nazari et al. | 375/262 |
| 7,388,525 B2 * | 6/2008 | Miyauchi et al. | 341/67 |
| 7,421,041 B2 * | 9/2008 | Khandekar et al. | 375/316 |
| 7,434,136 B2 * | 10/2008 | Ichihara et al. | 714/755 |
| 7,434,145 B2 * | 10/2008 | Jin et al. | 714/780 |
| 7,453,960 B1 * | 11/2008 | Wu et al. | 375/340 |
| 7,516,389 B2 * | 4/2009 | Song | 714/755 |
| 7,564,933 B2 * | 7/2009 | Marrow | 375/346 |
| 2003/0104788 A1 | 6/2003 | Kim | |

OTHER PUBLICATIONS

R. G. Gallager, "Low density parity check codes," IRE Trans. Info. Theory, vol. IT-8, pp. 21-28, Jan. 1962.

R. Gallager, Low-Density Parity-Check Codes, Cambridge, MA: MIT Press, 1963, 90 pages.

M. Luby, M. Mitzenmacher, M. A. Shokrollahi, D. A. Spielman, and V. Stennann, "Practical Loss-Resilient Codes", Proc. 29th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, No. 2, pp. 599-618, Feb. 2001.

L. R. Bahl, J. Cocke, F. Jelinek and J. Raviv, "Optimal decoding of linear codes for minimizing symbol error rate," IEEE Trans. Inform. Theory, vol. 20, pp. 284-287, Mar. 1974.

A. Kavčić and A. Patapoutian, "A Signal-Dependent Autoregressive Channel Model," IEEE Transactions on Magnetics, vol. 35, No. 5, Sep. 1999, pp. 2136-2138.

* cited by examiner

SYMBOL BY SYMBOL MAP DETECTION FOR SIGNALS CORRUPTED BY COLORED AND/OR SIGNAL DEPENDENT NOISE

CROSS REFERENCE TO RELATED PATENTS/PATENT APPLICATIONS

Provisional Priority Claims

The present U.S. Utility patent application claims priority pursuant to 35 U.S.C. §119(e) to the following U.S. Provisional Patent Application which is hereby incorporated herein by reference in its entirety and made part of the present U.S. Utility patent application for all purposes:

1. U.S. Provisional Application Ser. No. 60/785,243, entitled "Symbol by symbol MAP detection for signals corrupted by colored and/or signal dependent noise," filed Thursday, Mar. 23, 2006, pending.

BACKGROUND OF THE INVENTION

1. Technical Field of the Invention

The invention relates generally to communication systems; and, more particularly, it relates to performing detecting and/or calculating soft information that is employed when performing iterative decoding processing of coded signals of such communication systems.

2. Description of Related Art

Data communication systems have been under continual development for many years. One such type of communication system that continues to be of significant interest is that which employs iterative error correction codes. Some examples of iterative correction codes include LDPC (Low Density Parity Check) codes and turbo codes. Communications systems with iterative codes are often able to achieve lower BER (Bit Error Rate) than alternative codes for a given SNR (Signal to Noise Ratio).

A continual and primary directive in this area of development has been to try continually to lower the SNR required to achieve a given BER within a communication system. The ideal goal has been to try to reach Shannon's limit in a communication channel. Shannon's limit may be viewed as being the data rate to be used in a communication channel, having a particular SNR, that achieves error free transmission through the communication channel. In other words, the Shannon limit is the theoretical bound for channel capacity for a given modulation and code rate.

Looking at error correcting LDPC codes, various types of LDPC codes have been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

Error correcting codes can be employed within any communication system in which correction of errors is desired. Many iterative decoders that decode according to an error correcting code perform detection which involves calculating soft information which is used for the iterative decoding processing. One prior art approach for performing this detection is the BCJR approach as described in the following reference [a].

[a] L. R. Bahl, J. Cocke, F. Jelinek and J. Raviv, "Optimal decoding of linear codes for minimizing symbol error rate," IEEE Trans. Inform. Theory, vol. 20, pp. 284-287, March 1974.

The approach as described in reference [a] approach is sometimes also referred to as the MAP detection approach, which maximizes the "a posteriori" probability thereby minimizing the error probability. For example, in the problem of detection in the presence of noise, it is well-known that the estimate which maximizes the "a posteriori" probability minimizes the error probability. If it is desired to perform sequence detection in the presence of additive noise, then if the value r denotes the received sequence, then the sequence t which maximizes the probability, $p(t|r)$, is called the MAP estimate. This MAP estimate minimizes the probability of sequence error. If the symbol-by-symbol MAP estimates are desired, then the estimate which maximizes the "a posteriori" symbol probability minimizes the symbol error probability.

The BCJR approach, as described in reference [a], can be used to find the symbol-by-symbol MAP estimates in some communication system applications, and it is widely used in turbo codes since it can be used to compute the soft information (e.g., the LLRs (log likelihood ratios)). However, there are many instances in which the BCJR approach is not sufficient or adequate to perform the detection. For example, when the additive noise is uncorrelated, then the BCJR approach works well. However, some applications include noise which is not additive white, but the noise is additive colored. The BCJR approach does not work well in such applications. For example, in magnetic recording systems, the communication channel is not an AWGN (Additive White Gaussian Noise) communication channel. In addition, the noise in some communication systems is also signal-dependent which makes the straightforward BCJR approach described in reference [a] infeasible.

In general, signals that have been corrupted by colored and/or signal-dependent noise cannot rely on the BCJR approach for performing detection. Nevertheless, within communication systems that employ iterative error correction decoding processing, the soft information (e.g., the LLRs) still needs to be calculated. Unfortunately, the BCJR approach to calculating this soft information cannot be employed for communication systems including signals that are corrupted by colored and/or signal-dependent noise.

There does not presently exist in the art a means to do this within communication systems employing iterative error correction decoding processing that have signals that are corrupted by colored, signal-dependent noise. Some examples of such communication systems include magnetic recording systems and other communication system types. There exists a need in the art to calculate such soft information for use in iterative decoding processing when the signals are in fact corrupted by colored and/or signal-dependent noise.

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

A novel approach is presented herein by which symbol by symbol MAP (maximum "a posteriori" probability) detection can be performed to obtain soft information (e.g., LLRs (log likelihood ratios)) for signals that have undesirably been corrupted by colored and/or signal-dependent noise. In many communication systems, the communication channel introduces AWGN (Additive White Gaussian Noise) and at the output of an equalizer at the receiver end of the communication channel, and any white noise added within the communication channel can be reflected as colored noise.

Consequently, the detector has to deal with colored noise within the signal. In many iterative error correction decoding systems, if soft information is a requirement for use in the decoding processing, then the prior art BCJR approach (described above within reference [a] identified above) cannot be used. In storage systems (e.g., hard disk drive (HDD) systems), the BCJR approach is not plausible because the noise is not only colored but also signal-dependent. Therefore, there is a need in the art to provide for a means by which soft information can be calculated for signals that have been corrupted by colored and/or signal-dependent noise.

Figure 1:
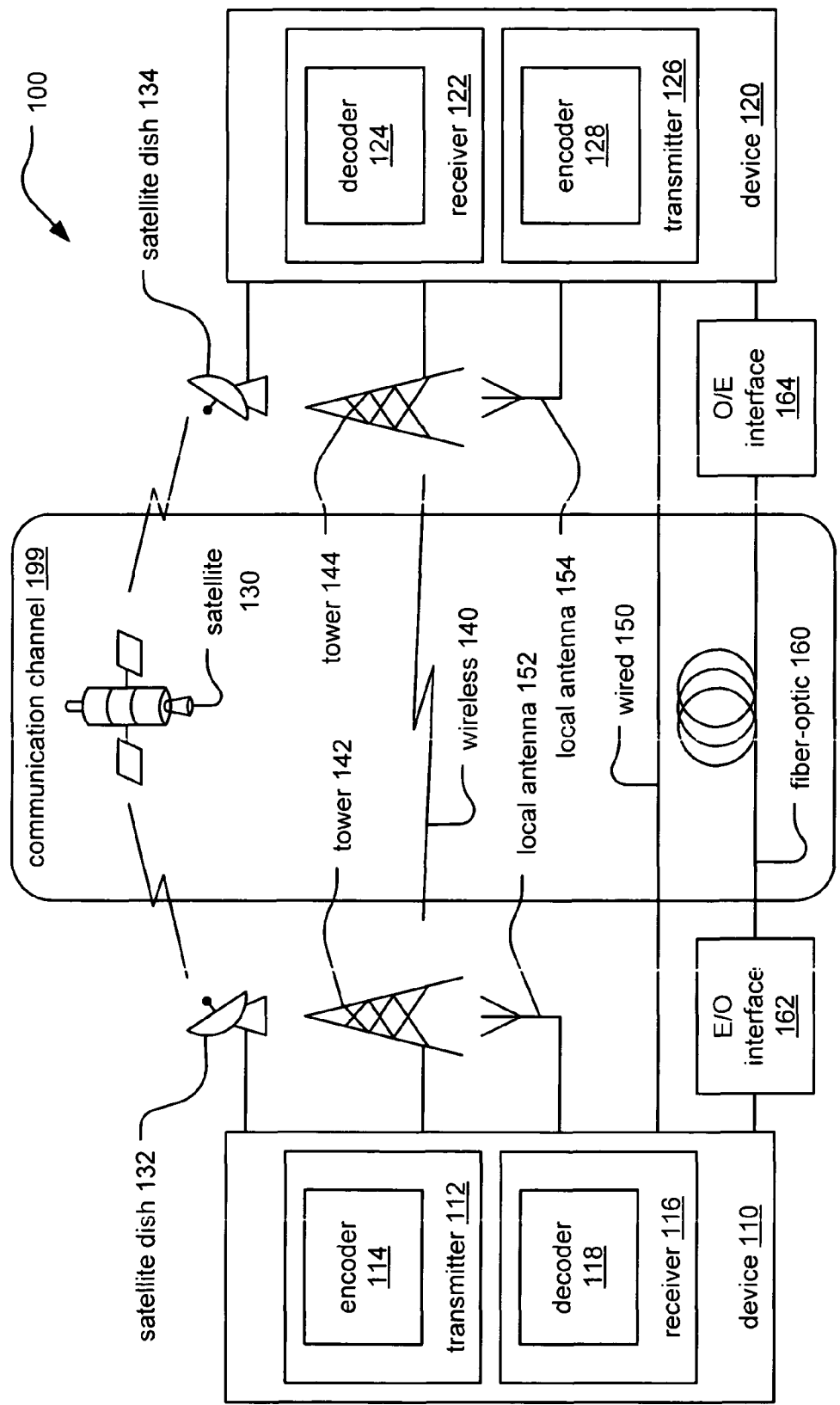
FIG. 1 and FIG. 2 illustrate various embodiments of communication systems.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
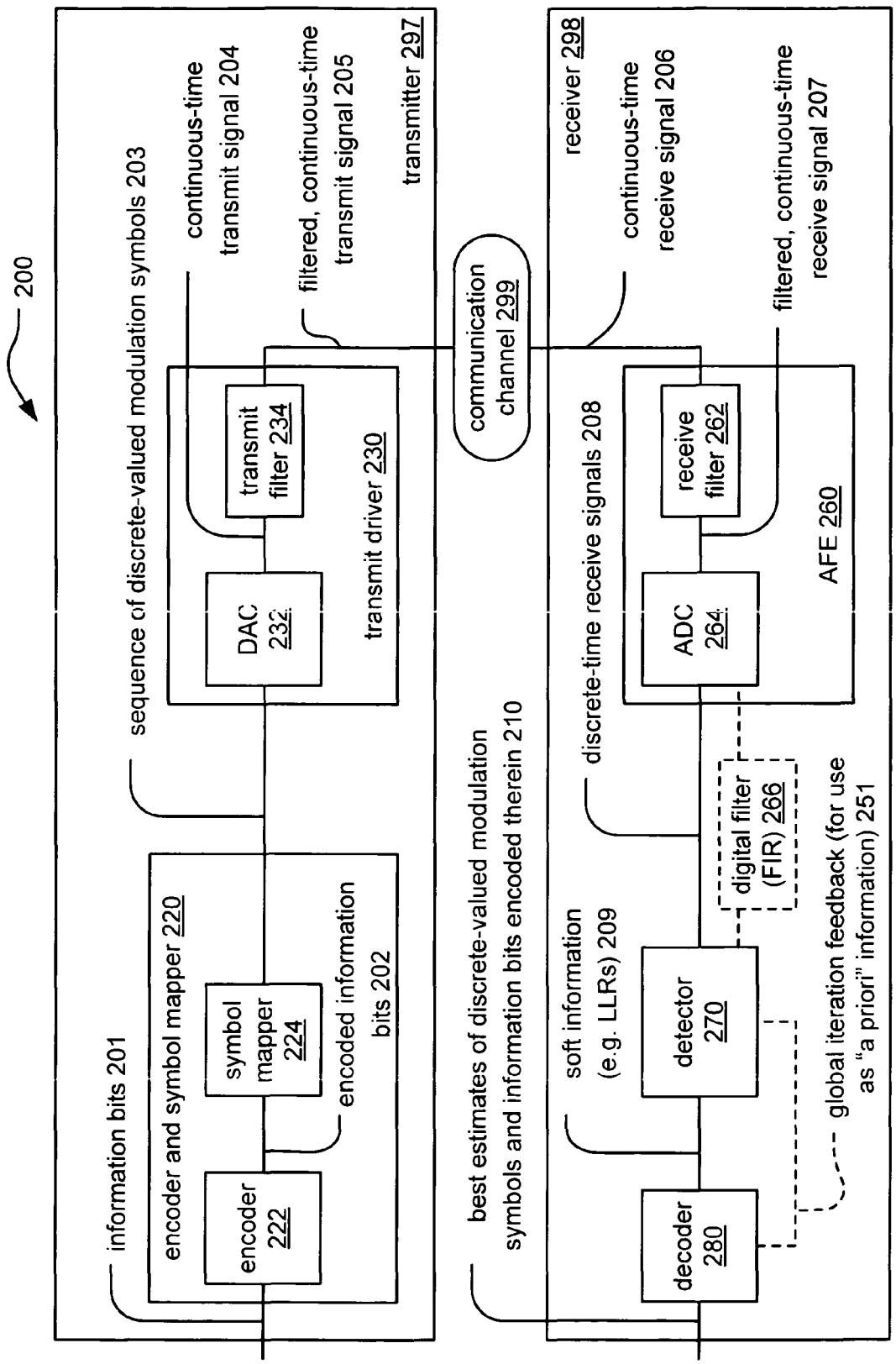

FIG. 1 and FIG. 2 are diagrams illustrate various embodiments of communication systems, 100 and 200, respectively.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 that is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (analog front-end) 260 that includes a receive filter 262 (that generates a filtered, continuous-time receive signal 207) and an ADC (analog to digital converter) 264 (that generates discrete-time receive signals 208). If desired, a digital filter (e.g., a finite impulse response (FIR) filter) 266 can be implemented to perform some digital filtering on the discrete-time receive signals 208.

A detector 270 calculates soft information (e.g., LLRs) 209 that are employed by a decoder 280 to make best estimates of the discrete-valued modulation symbols (or samples) and information bits encoded therein 210. The decoders of either of the previous embodiments may be implemented to include various aspects and/or embodiment of the invention therein. Generally speaking, the decoders are iterative error correction decoders that are operable to perform a plurality of local decoding iterations therein. If desired, more than one global decoding iteration can be performed such that "a priori" information is fed back from the decoder 280 to the detector 270 for use in calculating updated soft information 209 that can be used to perform a second plurality of local decoding iterations within the decoder 280.

In addition, several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects and/or embodiments of the invention. One particular type of signal that is processed according to certain aspects and/or embodiments of the invention is an LDPC coded signal. Before more details are provided below, a general description of LDPC codes is provided.

Figure 3:
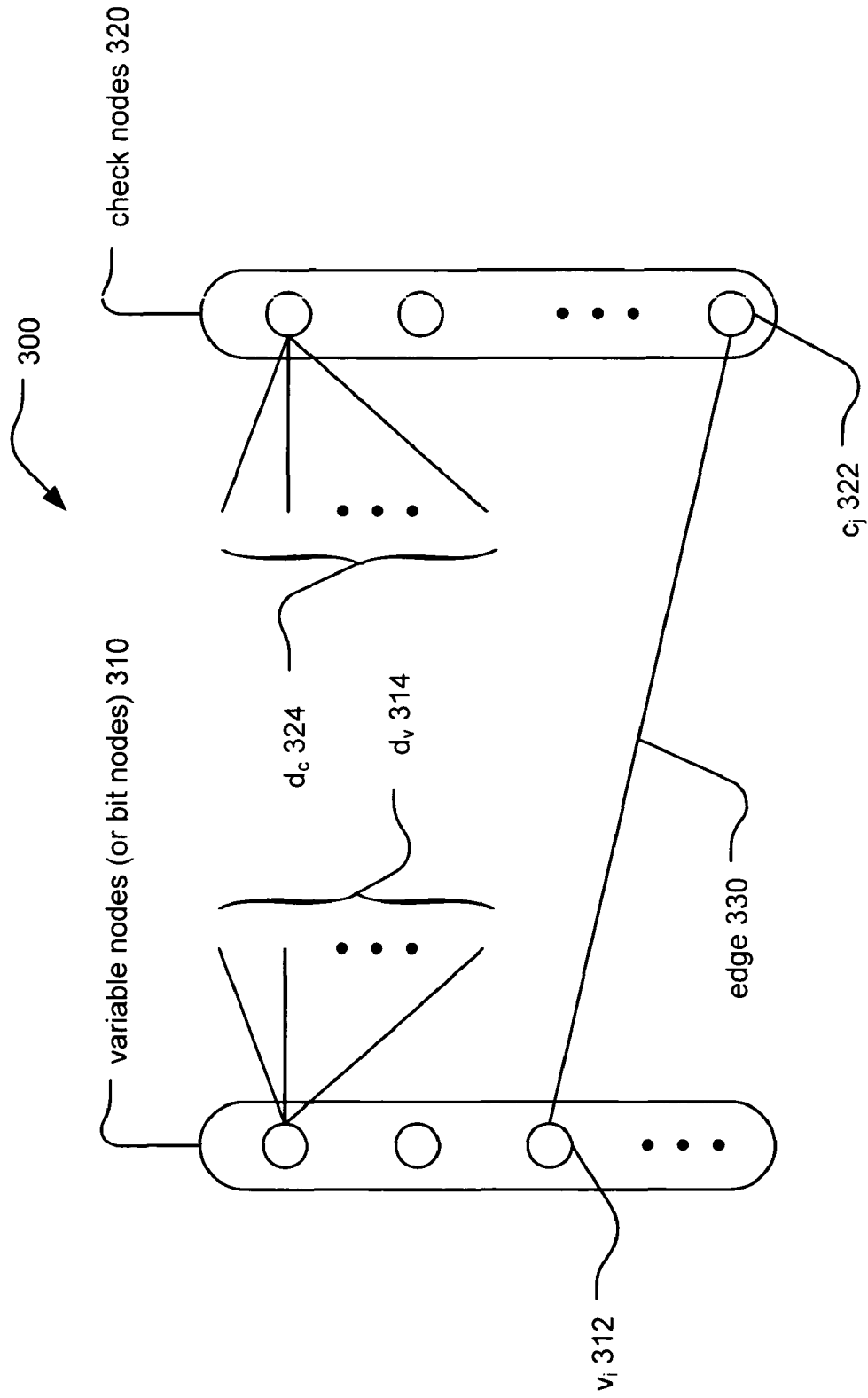
FIG. 3 illustrates an embodiment of an LDPC (Low Density Parity Check) code bipartite graph.

FIG. 3 illustrates an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse) For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes, Cambridge, Mass.: MIT Press*, 1963.

[2] M. G. Luby, M. Mitzenmacher, M. A. Shokrollahi, D. A. Spielman, and V. Stemann, "Practical Loss-Resilient Codes", *Proc. 29$^{th}$ Symp. on Theory of Computing*, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by $e=(i, j)$. However, on the other hand, given an edge $e=(i, j)$, the nodes of the edge may alternatively be denoted as by $e=(v(e),c(e))$ (or $e=(b(e), c(e))$). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda, \rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects and/or embodiments of the invention are also operable to accommodate both regular LDPC codes and irregular LDPC.

Figure 4:
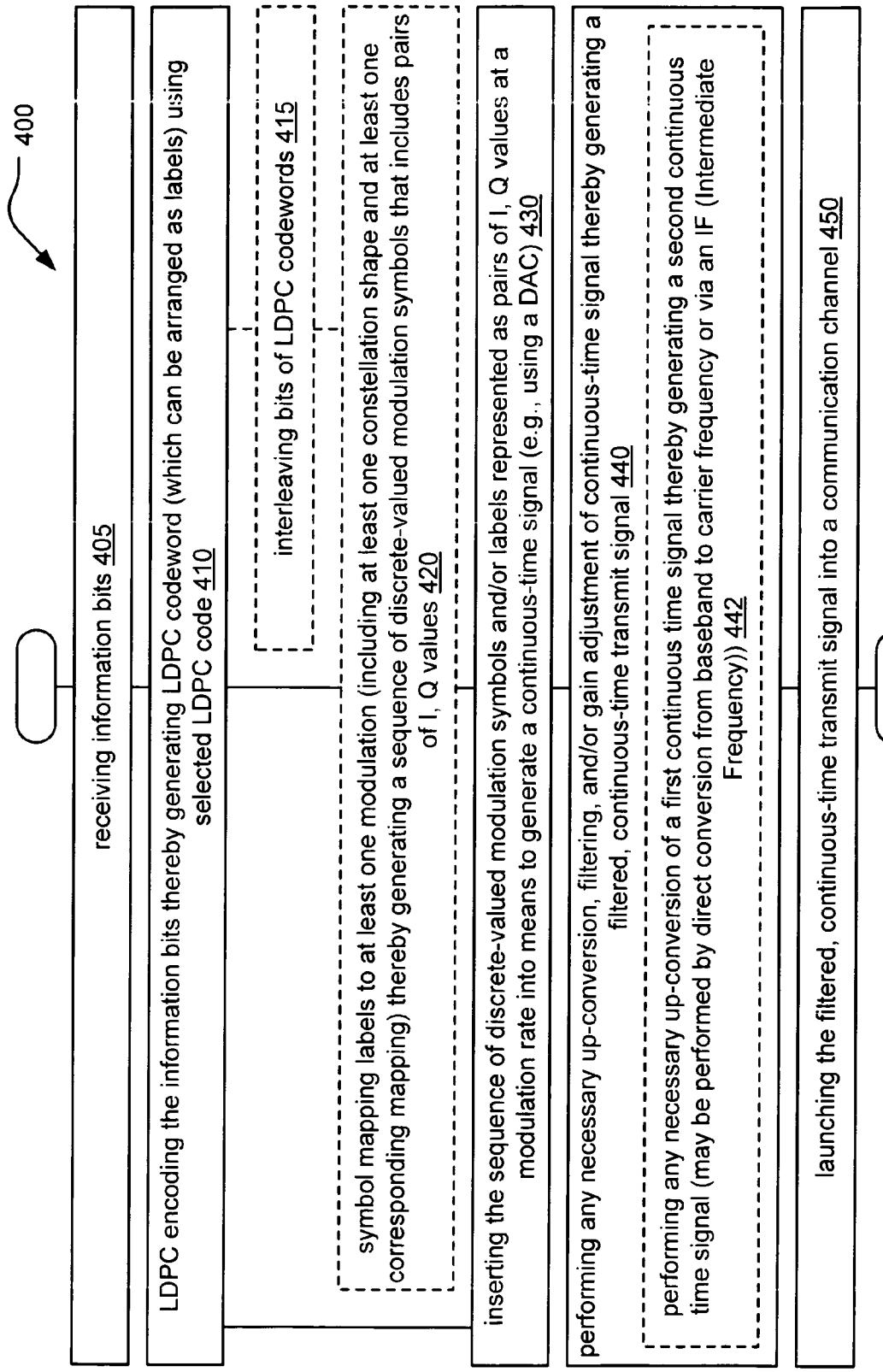
FIG. 4 illustrates an embodiment of a method for transmit processing of an LDPC coded signal.

FIG. 4 illustrates an embodiment of a method 400 for transmit processing of an LDPC coded signal. The method 400 that may be viewed as being performed at a transmitter end of a communication channel.

This method 400 also may be viewed as involving the generation of an LDPC coded signal as well as any operations to that are required to comport the LDPC coded signal to a communication channel into which a corresponding continuous-time transmit signal is to be launched.

Initially, this method 400 involves receiving information bits, as shown in a block 405. These information bits correspond to the actual information that is desired to be transmitted from one end of a communication channel to the other. At the other end, an effort to making best estimates of these original information bits is made. Continuing on, this method 400 involves LDPC encoding the information bits thereby generating an LDPC codeword (which can be arranged as labels), as shown in a block 410. For example, the LDPC codeword (or LDPC block) can be arranged to include labels that all have the same number of bits or labels of different bit sizes. This encoding may be performed using a selected LDPC code. In some instances, the method 400 may also involve interleaving the bits of a LDPC codeword after encoding them using an LDPC code, as shown in a block 415.

Then, as shown in a block 420, the method 400 then continues by symbol mapping the labels to at least one modulation (that includes at least one constellation shape and at least one corresponding mapping). In some embodiments, these labels are symbol mapped to a number of different modulation types thereby generating a variable modulation and/or code rate signal whose modulation and/or code rate may vary as frequently as on a frame by frame basis or even as frequently as on a symbol by symbol basis. This symbol mapping of the labels to at least one modulation thereby generates a sequence of discrete-valued modulation symbols that includes pairs of I, Q values (or higher dimensional constellation). At this point, the sequence of discrete-valued modulation symbols may be viewed as being an LDPC coded modulation signal (being in completely digital form at this point).

The method 400 then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method 400 may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram shows a method 500 that may be viewed as being performed at a receiver end of a communication channel. This received continuous-time signal may be viewed, in some embodiments, as being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). The diagram illustrated and described below shows the method 500 by which the receive processing of such a received continuous-time signal (e.g., at a receiver end of a communication channel) may be performed in an effort ultimately to make best estimates of the information bits that had been encoded therein.

Figure 5:
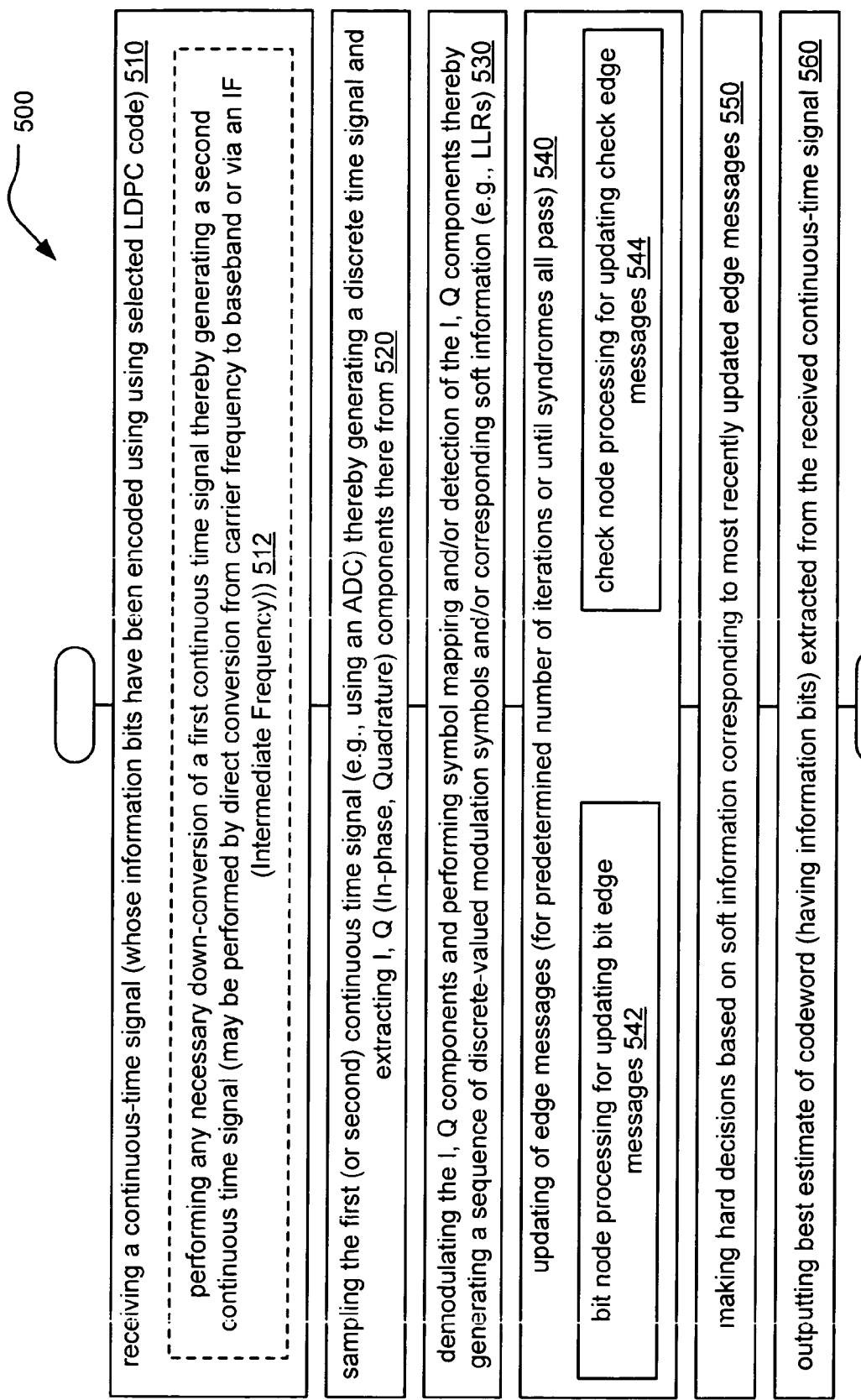
FIG. 5 illustrates an embodiment of a method for receive processing of an LDPC coded signal.

FIG. 5 illustrates an embodiment of a method 500 for receive processing of an LDPC coded signal. The method 500 initially involves receiving a continuous-time signal, as shown in a block 510. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method 500.

The method 500 also involves sampling the first (or second) continuous-time signal thereby generating a discrete time signal and extracting I, Q (In-phase, Quadrature) components there from, as shown in a block 520. This sampling may be performed using an ADC (analog to digital converter) or equivalent means to generate the discrete time signal from the appropriately down-converted (and potentially also filtered) received continuous-time signal. The I, Q components of the individual samples of the discrete time signal are also extracted within this step. The method 500 then involves demodulating the I, Q components and performing symbol mapping and/or detection of the I, Q components thereby generating a sequence of discrete-valued modulation symbols and/or corresponding soft information (e.g., LLRs (log likelihood ratios)), as shown in a block 530.

The next step of the method 500 of this embodiment involves performing updating of edge messages for a predetermined number of iterations (or until all syndromes of the LDPC code pass), as shown in a block 540. This step may be viewed as performing the LDPC decoding in accordance with any of the various embodiments described above. This LDPC decoding generally involves bit node processing for updating bit edge messages (as shown in a block 542) as well as check node processing for updating check edge messages (as shown in a block 544).

After the final decoding iteration of the predetermined number of decoding iterations (or until all syndromes of the LDPC code are equal to zero (i.e., all syndromes pass) in an alternative embodiment), the method 500 involves making hard decisions based on soft information corresponding to most recently updated edge messages with respect to the bit nodes, as shown in a block 550. The method 500 ultimately involves outputting a best estimate of the codeword (that includes the information bits) that has been extracted from the received continuous-time signal, as shown in a block 560.

Figure 6:
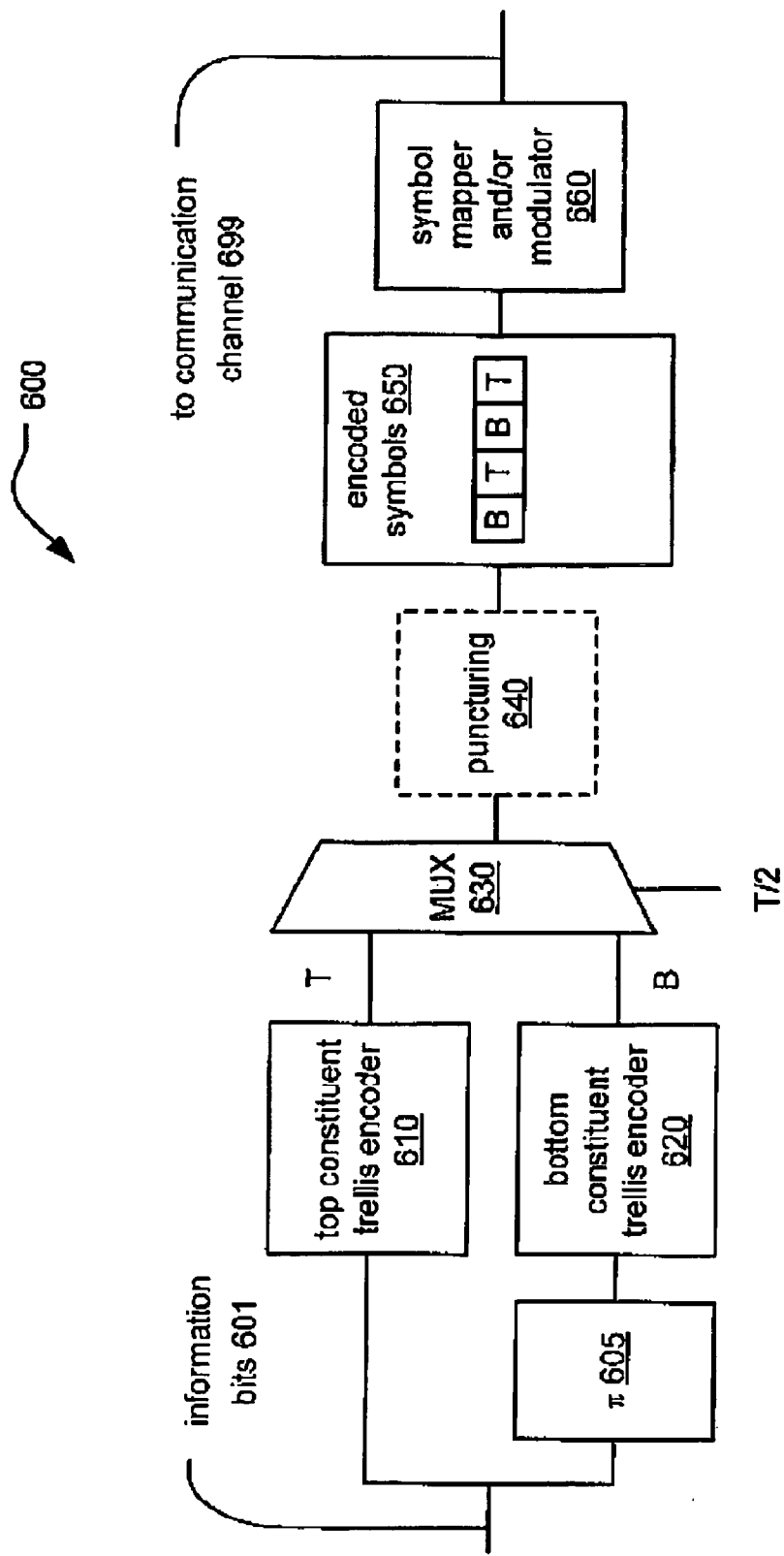
FIG. 6 illustrates an embodiment of a turbo encoder having a single interleaver.

FIG. 6 illustrates an embodiment of a turbo encoder having a single interleaver (shown as $\pi$ 605). Information bits 601 are provided simultaneously to a top path and a bottom path. The top path includes a top constituent trellis encoder 610, and the bottom path includes a bottom interleaver (shown as $\pi$ 605) communicatively coupled to a bottom constituent trellis encoder 620. A variety of interleaves may be performed as selected for the particular application within the bottom interleaver. Alternatively embodiments may include two separate interleavers as well, such that the path leading to each of top path and the bottom path is interleaved to some degree.

The outputs from the top and bottom paths are provided to a multiplexor (MUX) 630 whose selection is provided by a clock signal that is clocked at ½ the rate at which the input bits are provided to the top and bottom paths. This way, the output of the MUX 630 will alternatively select the outputs from the top and bottom paths.

If desired in some embodiments, the bits output from the MUX 630 are then output to a puncturing module 640. In certain embodiments, no puncturing is performed on the bits output from the MUX 630; they are all simply passed as output from the puncturing module 640. A variety of encoded symbols 650 (which can alternatively be referred to as labels) may then be then generated according to the outputs from the top and bottom paths; the bottom path being an interleaved path. These encoded symbols 650 are then passed to the symbol mapper and/or modulator 660 according to the invention where the symbols are mapped according to the appropriate modulation (constellation and mapping) thereby forming a continuous time signal that comports with a communication channel (as shown by reference numeral 699). In a baseband implementation, a simply binary phase shift keying (BPSK) modulation format may be employed (e.g., where no higher order modulations are employed). The single interleaver embodiment of the turbo encoder 600 shows just one of the many embodiments in which error correction encoding may be performed.

It is noted that the interleaver (shown as $\pi$ 605) within the FIG. 6 may be implemented such that it operates to correspond the order of the information bits 601 with the order in which the encoded symbols 650 are output and provided to the symbol mapper and/or modulator 660. That is to say, the first output, encoded symbol corresponds to the first group of information bits (or first input symbol); the second output, encoded symbol corresponds to the second group of information bits (or second input symbol). Alternatively, the interleaver (shown as π 605) may be implemented such that corresponding the order of the input bits (or symbols) need not necessarily correspond to the output order of the encoded symbols to the input order of the groups of input bits (or input symbols).

Figure 7:
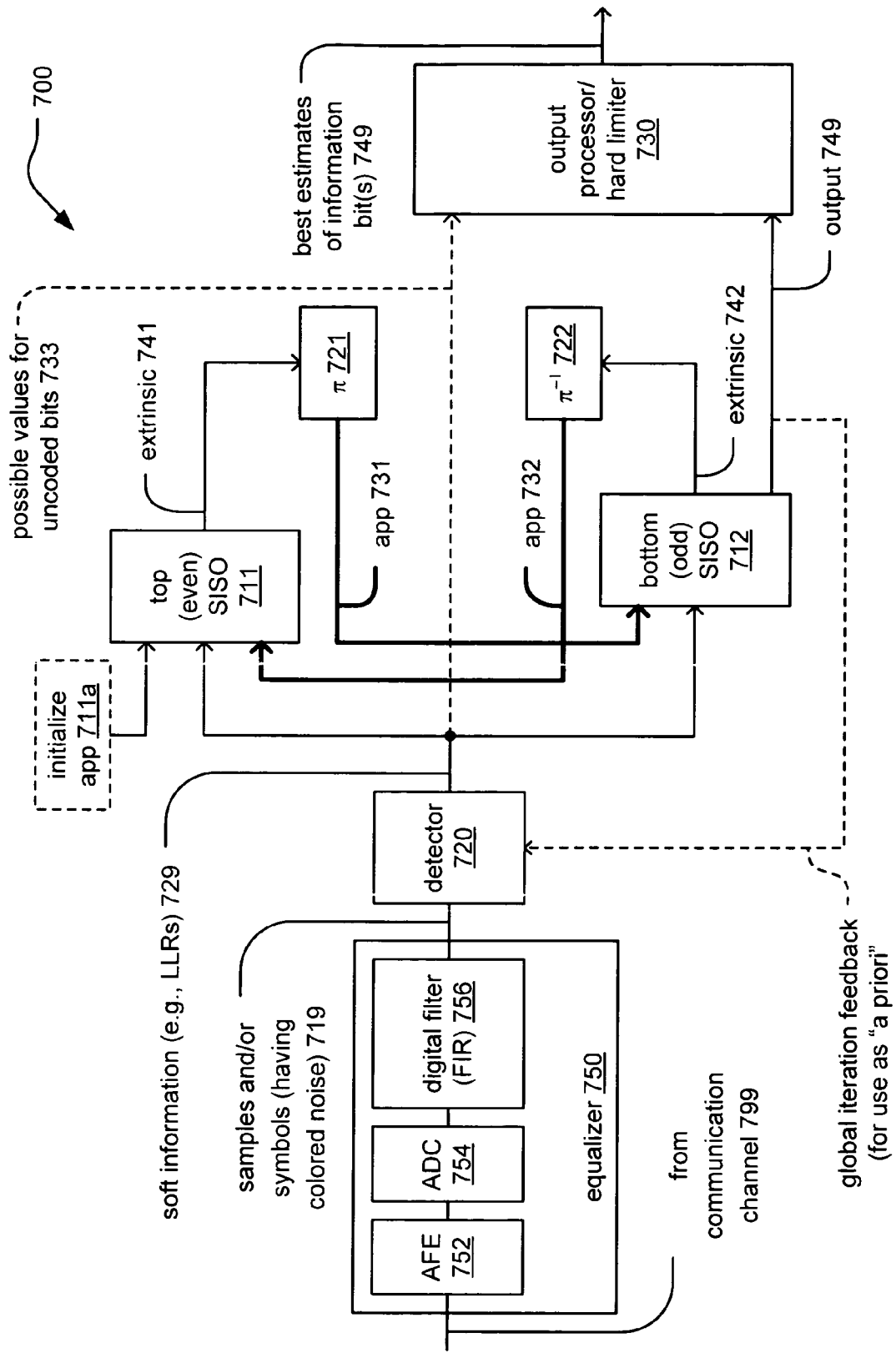
FIG. 7 illustrates an embodiment of a turbo decoder.

FIG. 7 illustrates an embodiment of a turbo decoder 700. A continuous time signal is received from a communication channel (as shown by reference numeral 799). This continuous time signal is provided to an equalizer 750 that includes an AFE (analog front-end) 752, an ADC (analog to digital converter) 754, and a digital filter (e.g., a finite impulse response (FIR) filter) 756. As required for a particular communication system implementation, the AFE 752 can perform any requisite analog filtering, frequency conversion, and/or gain control to get the signal into a format in which the ADC 754 can perform digital sampling. In some embodiments, no frequency conversion is required at all (e.g., baseband communication systems). The digital signal provided from the ADC 754 can then undergo digital filtering using the digital filter 756. The output of the equalizer 750 is then a sequence of samples and/or symbols (having colored noise) 719.

The sequence of samples and/or symbols (having colored noise) 719 is then provided to a detector 720 that is operable to calculate soft information 729 there from for use in perform iterative error correction decoding. In some embodiments, this soft information 729 is implemented as LLRs (log likelihood ratios) that serve as the initial values employed within the iterative decoding processing.

Continuing on with the decoding process and functionality, the soft information 729 that is calculated by the detector 720 is then provided to a top (even) soft-in soft-out (SISO) 711 and simultaneously to a bottom (odd) SISO 712. Each of these SISOs 711 and 712 calculates forward metrics (alphas, or α) and backward metrics (betas, or β), and extrinsic values according to the particular trellis employed. The values employed as "a priori probability" or "app" can be initialized as shown by reference numeral 711a.

These alphas (α), betas (β), and extrinsics are all calculated for each sample or symbol within a frame of data that is to be decoded. These calculations of alphas (α), betas (β), and extrinsics are all based on the trellis that is employed to perform the demodulation of the sample and/or symbols from the continuous time signal that is received from the communication channel.

Starting with the top SISO 711, after the extrinsic values 741 have been calculated, they are passed to an interleaver (shown as π 721) after which it is passed to the bottom SISO 712 as "a priori probability" (app) information 731. Similarly, after extrinsic values 742 have been calculated within the bottom SISO 712, they are passed to a de-interleaver (shown as π$^{-1}$ 722) after which it is passed to the top SISO 711 as "a priori probability" (app) information. It is noted that a single decoding iteration, within the iterative decoding process of the turbo decoder 700 consists of performing two SISO operations; that is to say, the iterative decoding process must pass through both the top (even) SISO 711 and through the bottom (odd) SISO 712.

This iterative decoding processing can be performed for a plurality of iterations. These decoding iterations that involves the top (even) SISO 711 and through the bottom (odd) SISO 712 can be viewed as being local decoding iterations. If desired, more than one global iteration can be performed by which an output 749 from the bottom (odd) SISO 712 is passed back to the detector 720 as "a priori" information (as shown using reference numeral 751). Subsequent soft information 729 is then calculated for this next global iteration, and the local decoding iterations are performed just as described above, with the exception that this time, they begin with "second" soft information 729. It is noted that the number of local and/or global decoding iterations can be selected by a designer based on a wide variety of considerations.

After a significant level of confidence has been achieved and a solution is being converged upon, or after a predetermined number of decoding iterations have been performed, then the output from the bottom (odd) SISO 712 is passed as the output 749 to an output processor 730 that is operable to provide best estimates of the information bit(s) 749. It is also noted that no global iterations need be performed in a particular embodiment. The operation of the SISOs 711 and 712 may generally be referred to as calculating soft symbol decisions of the symbols and/or samples contained within the received frame of data.

Figure 8:
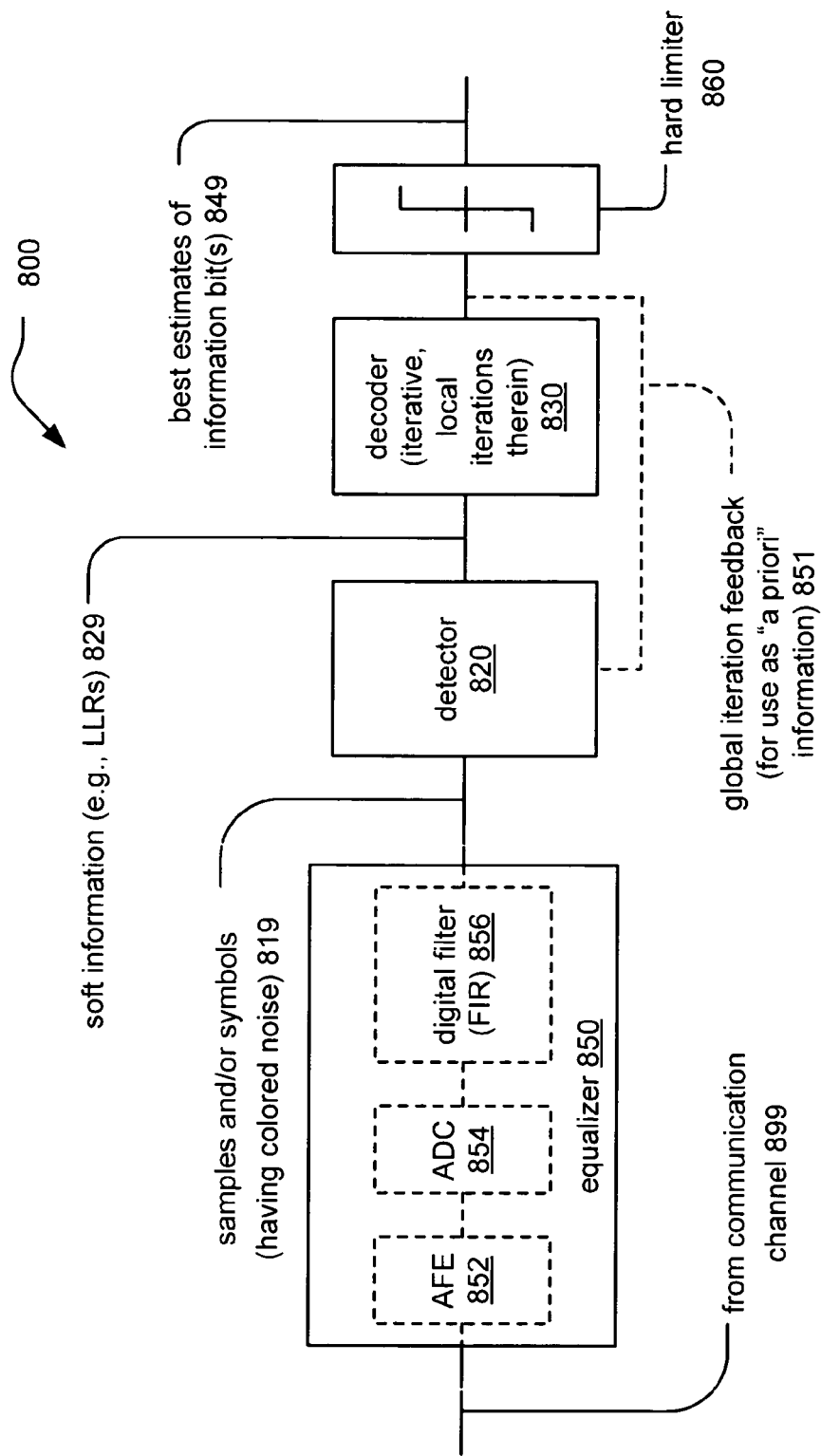
FIG. 8 illustrates an embodiment of an apparatus including a detector and an iterative decoder.

FIG. 8 illustrates an embodiment of an apparatus 800 including a detector 820 and an iterative decoder 830. Somewhat analogous to other embodiments described herein, a continuous time signal is received from a communication channel (as shown by reference numeral 899). This continuous time signal is provided to an equalizer 850. This equalizer 850 can be implemented in a variety of ways. One embodiment of the equalizer 850 includes an AFE (analog front-end) 852, an ADC (analog to digital converter) 854, and a digital filter (e.g., a finite impulse response (FIR) filter) 856. As required for a particular communication system implementation, the AFE 852 can perform any requisite analog filtering, frequency conversion, and/or gain control to get the signal into a format in which the ADC 754 can perform digital sampling. In some embodiments, no frequency conversion is required at all (e.g., baseband communication systems). The digital signal provided from the ADC 854 can then undergo digital filtering using the digital filter 856. The output of the equalizer 850 is then a sequence of samples and/or symbols (having colored noise) 819.

The sequence of samples and/or symbols (having colored noise) 819 is then provided to a detector 820 that is operable to calculate soft information 829 there from for use in perform iterative error correction decoding. In some embodiments, this soft information 829 is implemented as LLRs (log likelihood ratios) that serve as the initial values employed within the iterative decoding processing by a decoder 830 (that is iterative in nature).

This apparatus 800 generally depicts the decoder 830 therein that is operable to perform one or more local decoding iterations. The decoder 830 can be implemented as an LDPC decoder, a turbo decoder, a turbo trellis coded modulation (TTCM) decoder, or any type of iterative decoder that employs soft information (e.g., the soft information 829, which can be provided in the form of LLRs, if desired). The final soft symbol estimates (or soft sample estimates) generated by the decoder 830 can be fed back as "a priori" information for use in a global decoding iteration in which subsequent soft information 829 is calculated. As mentioned above with respect to other embodiments, it is noted that the number of local and/or global decoding iterations can be selected by a designer based on a wide variety of considerations.

After all of the performed local and global decoding iterations are performed, then the output from the decoder 830 and provided to a hard limiter 860 that is operable to make hard decisions of the soft symbol estimates (or soft sample estimates) provided thereto. The output from the hard limiter 860 is the best estimates of the information bit(s) 849 (e.g., those information bits being those that have been encoded using an encoder type that corresponds to the type of decoder 830, such as an LDPC encoder, turbo encoder, TTCM encoder, etc.).

This diagram shows generally how a detector can be implemented in conjunction with any iterative type decoder that employs soft information within its decoding processing. It is noted that various methods and/or apparatus embodiments can be implemented to perform LDPC decoding, turbo decoding, or some other type of iterative decoding functionality to employ the soft information calculated using detector functionality as depicted herein. Additional details of the calculation of such soft information are provided below as well. Certain aspects of such soft information calculation can be performed within a wide variety of communication systems, including those embodiments described above.

Another apparatus or system employing error correction codes can be one that includes hard disk drives (HDD). Within such hard disk drives (HDDs), error correction coding (ECC) is sometimes employed to ensure the ability to correct for errors of data that is written to and read from the storage media of a HDD. The ECC allows the ability to correct for those errors within the error correction capability of the code. Some embodiments and details of such HDD embodiments are provided below.

Figure 9:
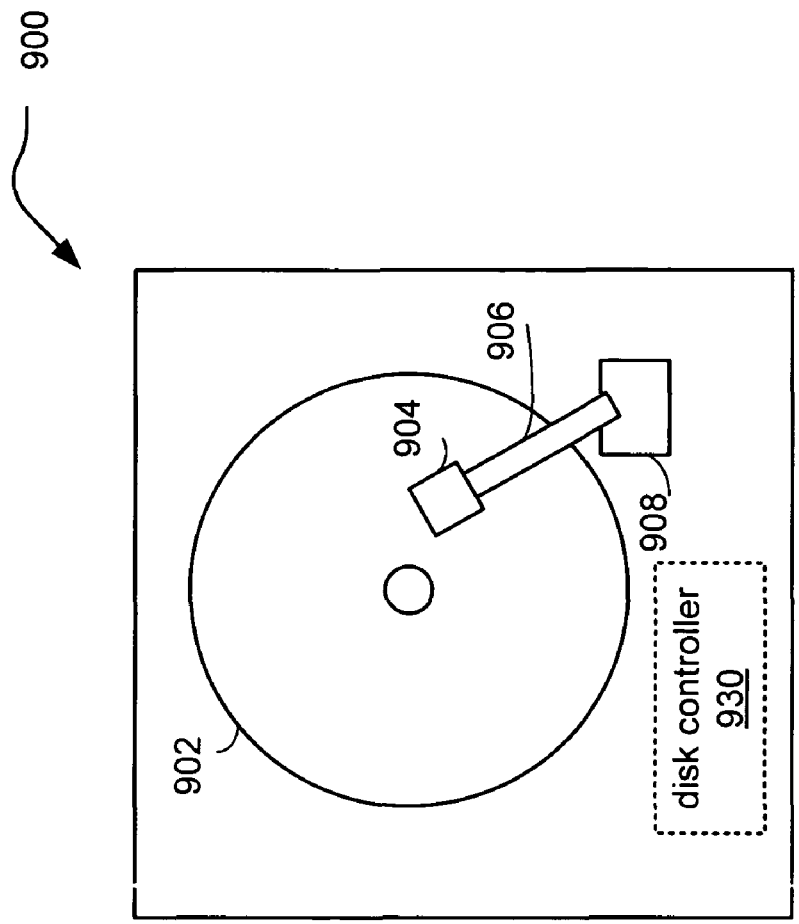
FIG. 9 illustrates an embodiment of a disk drive unit.

FIG. 9 illustrates an embodiment of a disk drive unit 900. In particular, disk drive unit 900 includes a disk 902 that is rotated by a servo motor (not specifically shown) at a velocity such as 3600 revolutions per minute (RPM), 4200 RPM, 4800 RPM, 5,400 RPM, 7,200 RPM, 10,000 RPM, 15,000 RPM; however, other velocities including greater or lesser velocities may likewise be used, depending on the particular application and implementation in a host device. In one possible embodiment, disk 902 can be a magnetic disk that stores information as magnetic field changes on some type of magnetic medium. The medium can be a rigid or non-rigid, removable or non-removable, that consists of or is coated with magnetic material.

Disk drive unit 900 further includes one or more read/write heads 904 that are coupled to arm 906 that is moved by actuator 908 over the surface of the disk 902 either by translation, rotation or both. A disk controller 930 is included for controlling the read and write operations to and from the drive, for controlling the speed of the servo motor and the motion of actuator 908, and for providing an interface to and from the host device.

Figure 10:
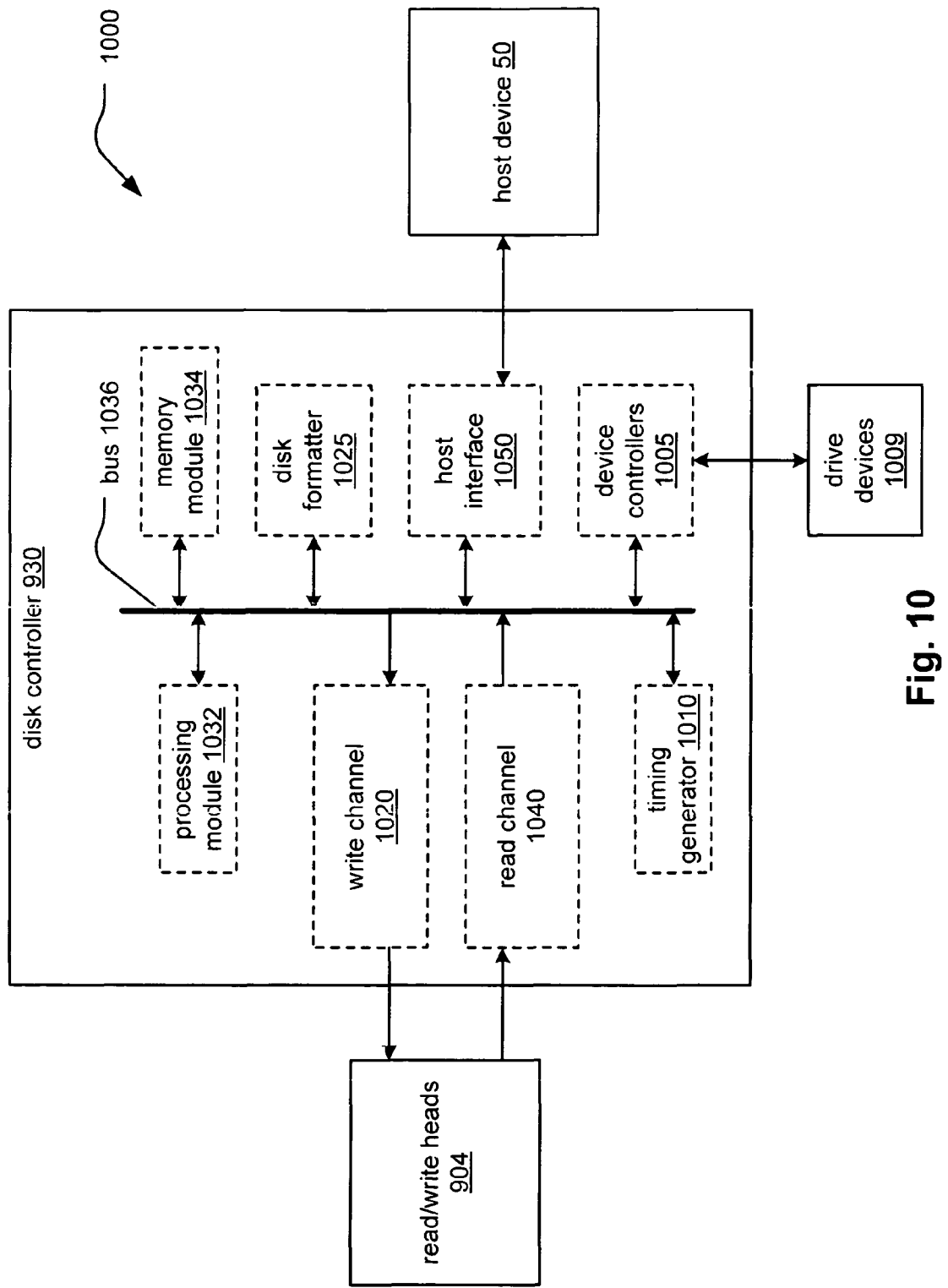
FIG. 10 illustrates an embodiment of a disk drive unit including a disk controller.

FIG. 10 illustrates an embodiment of a disk drive unit 1000 including a disk controller 930. Disk controller 930 includes a read channel 1040 and write channel 1020 for reading and writing data to and from disk 902 through read/write heads 904. Disk formatter 1025 is included for controlling the formatting of disk drive unit 1000, timing generator 1010 provides clock signals and other timing signals, device controllers 1005 control the operation of drive devices 1009 such as actuator 908 and the servo motor, etc. Host interface 1050 receives read and write commands from host device 50 and transmits data read from disk 902 along with other control information in accordance with a host interface protocol. In one possible embodiment of, the host interface protocol can include, SCSI, SATA, enhanced integrated drive electronics (EIDE), or any number of other host interface protocols, either open or proprietary, that can be used for this purpose.

Disk controller 930 further includes a processing module 1032 and memory module 1034. Processing module 1032 can be implemented using one or more microprocessors, microcontrollers, digital signal processors (DSPs), microcomputers, central processing units (CPUs), field programmable gate arrays (FPGAs), programmable logic devices (PLAs), state machines, logic circuits, analog circuits, digital circuits, and/or any devices that manipulates signal (analog and/or digital) based on operational instructions that are stored in memory module 1034. When processing module 1032 is implemented with two or more devices, each device can perform the same steps, processes or functions in order to provide fault tolerance or redundancy. Alternatively, the function, steps and processes performed by processing module 1032 can be split between different devices to provide greater computational speed and/or efficiency.

Memory module 1034 may be a single memory device or a plurality of memory devices. Such a memory device may be a read-only memory (ROM), random access memory (RAM), volatile memory, non-volatile memory, static random access memory (SRAM), dynamic random access memory (DRAM), flash memory, cache memory, and/or any device that stores digital information. Note that when the processing module 1032 implements one or more of its functions via a state machine, analog circuitry, digital circuitry, and/or logic circuitry, the memory module 1034 storing the corresponding operational instructions may be embedded within, or external to, the circuitry comprising the state machine, analog circuitry, digital circuitry, and/or logic circuitry. Further note that, the memory module 1034 stores, and the processing module 1032 executes, operational instructions that can correspond to one or more of the steps or a process, method and/or function illustrated herein.

Disk controller 930 includes a plurality of modules, in particular, device controllers 1005, processing timing generator 1010, processing module 1032, memory module 1034, write channel 1020, read channel 1040, disk formatter 1025, and host interface 1050 that are interconnected via bus 1036. Each of these modules can be implemented in hardware, firmware, software or a combination thereof, in accordance with the broad scope of the present invention. While the particular bus architecture is shown in FIG. 10 with a single bus 1036, alternative bus architectures that include additional data buses, further connectivity, such as direct connectivity between the various modules, are likewise possible to implement additional features and functions.

In one possible embodiment, one or more modules of disk controller 930 are implemented as part of a system on a chip (SOC) integrated circuit. In such a possible embodiment, this SOC integrated circuit includes a digital portion that can include additional modules such as protocol converters, linear block code encoding and decoding modules, etc., and an analog portion that includes device controllers 1005 and optionally additional modules, such as a power supply, etc. In an alternative embodiment, the various functions and features of disk controller 930 are implemented in a plurality of integrated circuit devices that communicate and combine to perform the functionality of disk controller 930.

Figure 11:
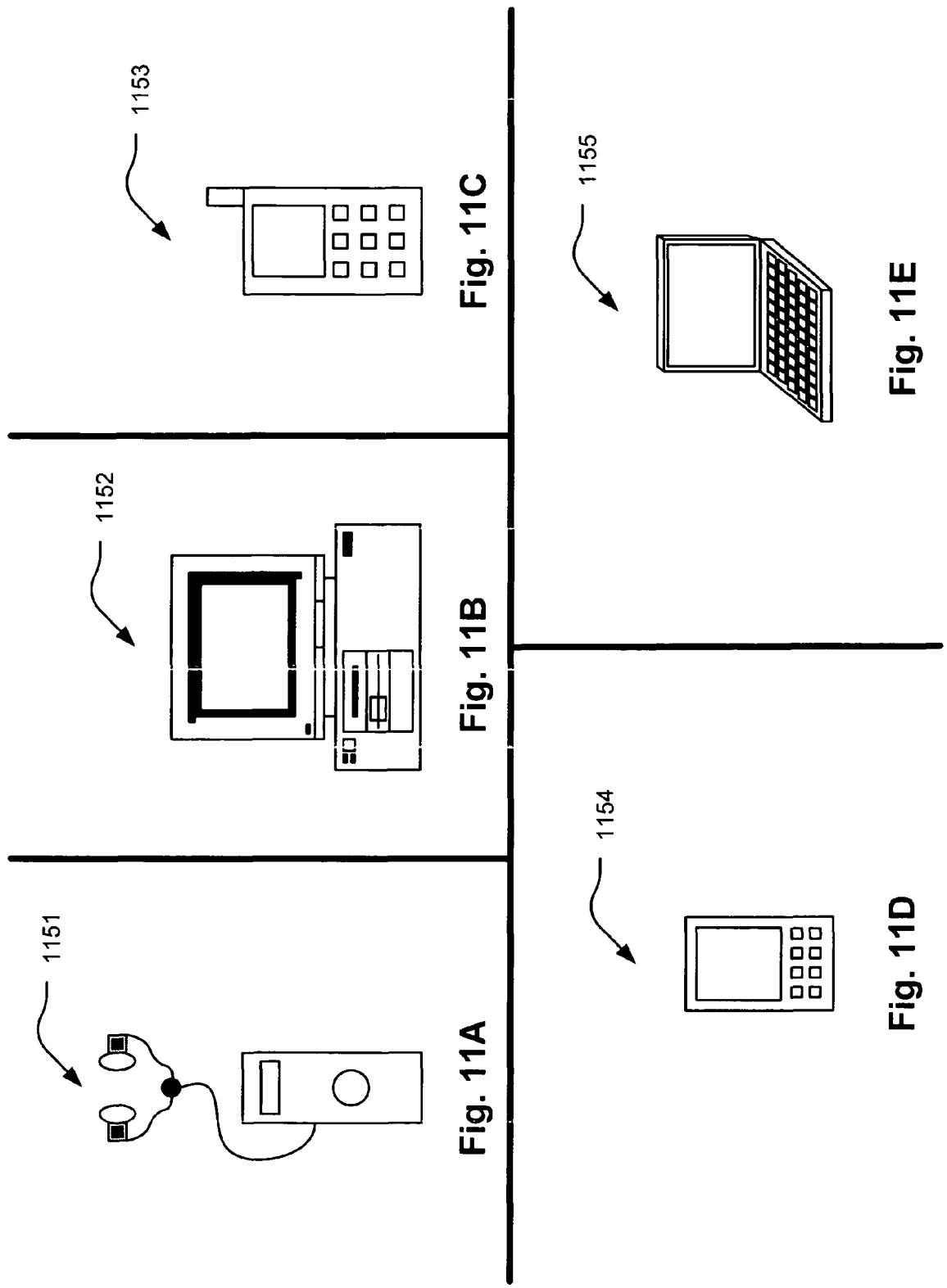
FIG. 11A illustrates an embodiment of a handheld audio unit.
FIG. 11B illustrates an embodiment of a computer.
FIG. 11C illustrates an embodiment of a wireless communication device.
FIG. 11D illustrates an embodiment of a personal digital assistant (PDA).
FIG. 11E illustrates an embodiment of a laptop computer.

FIG. 11A illustrates an embodiment of a handheld audio unit 1151. In particular, disk drive unit 900 can be implemented in the handheld audio unit 1151. In one possible embodiment, the disk drive unit 900 can include a small form factor magnetic hard disk whose disk 902 has a diameter 1.8" or smaller that is incorporated into or otherwise used by handheld audio unit 1151 to provide general storage or storage of audio content such as motion picture expert group (MPEG) audio layer 3 (MP3) files or Windows Media Architecture (WMA) files, video content such as MPEG4 files for playback to a user, and/or any other type of information that may be stored in a digital format.

FIG. 11B illustrates an embodiment of a computer 1152. In particular, disk drive unit 900 can be implemented in the computer 1152. In one possible embodiment, disk drive unit 900 can include a small form factor magnetic hard disk whose disk 902 has a diameter 1.8" or smaller, a 2.5" or 3.5" drive or larger drive for applications such as enterprise storage applications. Disk drive 100 is incorporated into or otherwise used by computer 1152 to provide general purpose storage for any type of information in digital format. Computer 1152 can be a desktop computer, or an enterprise storage devices such a server, of a host computer that is attached to a storage array such as a redundant array of independent disks (RAID) array, storage router, edge router, storage switch and/or storage director.

FIG. 11C illustrates an embodiment of a wireless communication device 1153. In particular, disk drive unit 900 can be implemented in the wireless communication device 1153. In one possible embodiment, disk drive unit 900 can include a small form factor magnetic hard disk whose disk 902 has a diameter 1.8" or smaller that is incorporated into or otherwise used by wireless communication device 1153 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats that may be captured by an integrated camera or downloaded to the wireless communication device 1153, emails, webpage information and other information downloaded from the Internet, address book information, and/or any other type of information that may be stored in a digital format.

In a possible embodiment, wireless communication device 1153 is capable of communicating via a wireless telephone network such as a cellular, personal communications service (PCS), general packet radio service (GPRS), global system for mobile communications (GSM), and integrated digital enhanced network (iDEN) or other wireless communications network capable of sending and receiving telephone calls. Further, wireless communication device 1153 is capable of communicating via the Internet to access email, download content, access websites, and provide steaming audio and/or video programming. In this fashion, wireless communication device 1153 can place and receive telephone calls, text messages such as emails, short message service (SMS) messages, pages and other data messages that can include attachments such as documents, audio files, video files, images and other graphics.

FIG. 11D illustrates an embodiment of a personal digital assistant (PDA) 1154. In particular, disk drive unit 900 can be implemented in the personal digital assistant (PDA) 1154. In one possible embodiment, disk drive unit 900 can include a small form factor magnetic hard disk whose disk 902 has a diameter 1.8" or smaller that is incorporated into or otherwise used by personal digital assistant 1154 to provide general storage or storage of audio content such as motion picture expert group (MPEG) audio layer 3 (MP3) files or Windows Media Architecture (WMA) files, video content such as MPEG4 files, JPEG (joint photographic expert group) files, bitmap files and files stored in other graphics formats, emails, webpage information and other information downloaded from the Internet, address book information, and/or any other type of information that may be stored in a digital format.

FIG. 11E illustrates an embodiment of a laptop computer 1155. In particular, disk drive unit 900 can be implemented in the laptop computer 1155. In one possible embodiment, disk drive unit 900 can include a small form factor magnetic hard disk whose disk 902 has a diameter 1.8" or smaller, or a 2.5" drive. Disk drive 100 is incorporated into or otherwise used by laptop computer 1152 to provide general purpose storage for any type of information in digital format.

Figure 12:
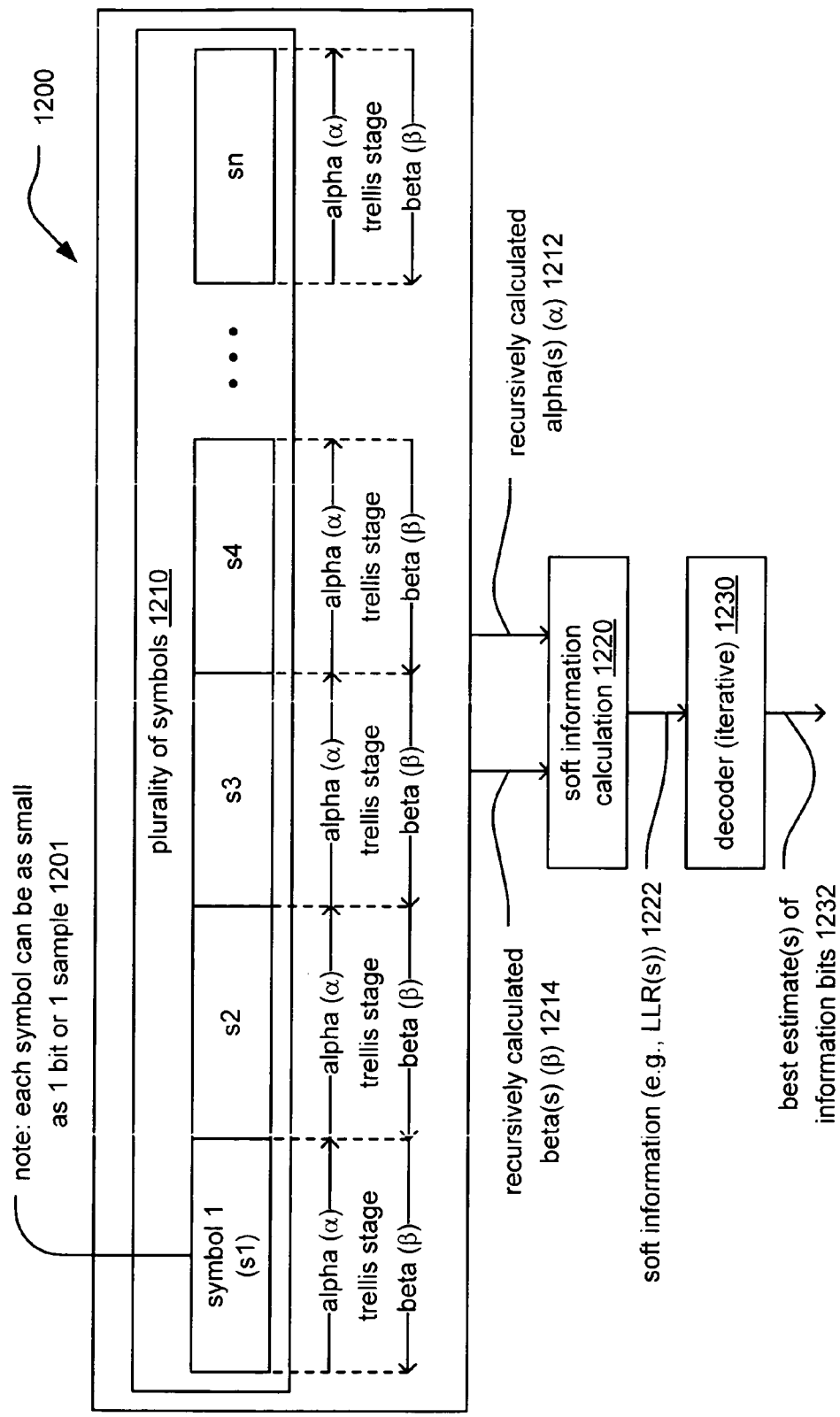
FIG. 12 illustrates an embodiment that performs soft information calculation

FIG. 12 illustrates an embodiment 1200 that performs soft information calculation. A plurality of symbols 1210 is received. As depicted using the reference numeral 1201, it is noted that each symbol within the plurality of symbols 1210 can be as small as 1 bit or 1 sample. Generally speaking, the term "symbol" is employed, yet the reader is reminded to keep in mind that a symbol can include as few as 1 bit or 1 sample. For example, in a baseband communication system that employs a binary phase shift keying (BPSK) modulation format, then each symbol is only 1 bit. Also, when using such a BPSK modulation format, each sample could also correspond to that 1 bit as well.

At the very beginning of the receipt of the plurality of symbols 1210, the forward metrics ($\alpha$) can begin to be calculated. Once all of the plurality of symbols 1210 have been received (e.g., once a frame of data has been received), then the backward metrics ($\beta$) can begin to be calculated.

It is noted that each symbol within the plurality of symbols (i.e., as depicted using s1, s2, . . . , sn) has corresponding forward metrics ($\alpha$) and backward metrics ($\beta$) as defined according to each trellis stage. The trellis is employed to perform the demodulation of the sample and/or symbols from a continuous time signal that is received from the communication channel. Generally speaking, in a communication system that incurs inter-symbol interference (ISI), a trellis can be employed to perform the demodulation of the symbols within the continuous time signal that is received from the communication system. The trellis can be viewed as being replicated to form a lattice structure, such that one trellis stage corresponds to each symbol within the plurality of symbols 1210. The lattice structure then spans the entirety of the plurality of symbols 1210, such that one trellis stage corresponds to each symbol of the plurality of symbols 1210.

The forward metrics ($\alpha$) and the backward metrics ($\beta$) are calculated recursively (more details of which are provided below). The recursively calculated forward metrics or alpha(s) ($\alpha$) 1212 and the recursively calculated backward metrics beta(s) ($\beta$) 1214 are then provided to a soft information calculation module 1220. The soft information calculation module 1220 then uses these recursively calculated forward metrics or alpha(s) ($\alpha$) 1212 and the recursively calculated backward metrics beta(s) ($\beta$) 1214 to calculate soft information 1222 for each symbol of the plurality of symbols 1210. If desired, this soft information 1222 can be calculated as LLRs (log likelihood ratios). The soft information 1222 is provided to a decoder 1230 (that is iterative in nature) which then uses the soft information 1222 to makes best estimates of the information bits of each symbol of the plurality of symbols 1210.

Referring to one particular type of communication system described above (i.e., those employed within systems or devices having a hard disk drive (HDD)), one possible channel model that can be employed for magnetic recording is provided in the following reference [4].

[4] A. Kavčić and A. Patapoutian, "A Signal-Dependent Autoregressive Channel Model," *IEEE Transactions on Magnetics*, vol. 35, no. 5, Sep. 1999, pp. 2136-2138.

A very brief summary of this channel model is provided here, and the reader is directed to reference [4] for more details.

A sampled signal that is received via a communication channel can be represented as follows:

$$z_k = y(a_{k-1}^k) + n_k, \text{ where for } k \geq 0:$$

1. the sequence $\{a_k\}$ is the communication channel input sequence of binary symbols;

2. $y(\alpha)$ is the noiseless output from the communication channel which depends on I+1 input symbols;

3. $\alpha = [a_{k-I}, a_{k-I+1}, a_{k-I+2}, \ldots, a_k]^T$;

4. I is the data memory length; and

5. $\{n_k\}$ is the additive noise sequence.

In this model, $y(\bullet)$ is chosen as a general look-up table (LUT) and not just a linear convolution operation between the I+1 input symbols and the channel impulse response. The noise term is the output of a signal-dependent autoregressive filter whose input is a zero-mean unit-variance white Gaussian noise sequence, $\{w_k\}$.

$$n_k = \sum_{i=1}^{L} b_i(a_{k-1}^k) n_{k-i} + \sigma(a_{k-1}^k) w_k. \quad \text{(eq 1)}$$

Again, the reader is directed to reference [4] for more details on this communication channel model.

As mentioned above, there are many embodiments that employ error correction decoding processing that require the calculation of soft information. This soft information can be provided in the form of LLRs (log likelihood ratios). The LLR of a symbol, $a_k$, can be defined as follows:

$$LLR(a_k) = \ln\left(\frac{P(a_k = 0 \mid Z)}{P(a_k = 1 \mid Z)}\right),$$

where Z is the received sequence.

For an AWGN communication channel, the BCJR approach (described in reference [a] identified above) cannot be used to obtain the LLRs using forward and backward recursion. Since the joint probability, $P(a_k, Z)$, can alternatively be computed to obtain the LLRs, and since there also is a one-to-one correspondence between the states (as defined with respect to the trellis employed to perform demodulation) and the sequence $\{a_k\}$ (i.e., the communication channel input sequence of binary symbols), then a new calculation can be employed to calculate the probability, $P(S_k, S_{k-1}, Z)$, and the LLR is then calculated as follows:

$$LLR(a_k) = \frac{\sum_{(l,m) \ni a_k = 0} \alpha_{k-1}(l) P\{Z_k \mid S_k = m, S_{k-1} = l, Z_1^{k-1}\} \beta_k(m)}{\sum_{(l,m) \ni a_k = 1} \alpha_{k-1}(l) P\{Z_k \mid S_k = m, S_{k-1} = l, Z_1^{k-1}\} \beta_k(m)},$$

where

The probability functions, $\alpha_k(m) = P\{S_k = m, Z_1^k\}$, and $\beta_k(m) = P\{Z_{k+1}^N \mid S_k = m\}$ define the forward and backward metrics analogously to those employed by the BCJR approach.

However, the probability, $P\{S_{k-1} = j, S_k = k, Z_1^N\}$, must be computed eventually. This term can be expressed as follows:

$$P\{S_{k-1}=j,S_k=k,Z_1^N\}=P\{S_{k-1}=j,Z_1^{k-1}\} \cdot P\{S_k=l \mid S_{k-1}=j, Z_1^{k-1}\} \cdot P\{Z_k=l \mid S_{k-1}=j, Z_1^{k-1}\} \cdot P\{Z_{k+1}^N \mid S_k=l, S_{k-1}=j, Z_1^k\}$$

Of the 4 terms of this probability as described above, the forward metric can be defined analogous to the BCJR approach as corresponding to the $1^{st}$ of the 4 terms as follows:

$$\alpha_{t-1}(j) = P\{S_{t-1} = j, Y_1^{t-1}\} \quad \text{(eq 2)}.$$

The $2^{nd}$ of the 4 terms of this probability simplifies as follows: $P\{S_k = l \mid S_{k-1} = j, Z_1^{k-1}\} = P\{S_k = l \mid S_{k-1} = j\}$, which is the "a priori" probability of the input information bits.

The last term ($4^{th}$ of the 4 terms) of this probability is defined as the backward metric as follows:

$$\beta_k(l) = P\{Z_{k+1}^N \mid S_k = l, S_{k-1} = j, Z_l^k\}.$$

The dependence on the state of the trellis at time k−1 (i.e., $S_{k-1} = j$) can be neglected as shown below, being the modification of the equation shown above in neglecting the dependence on the state of the trellis at time k−1.

$$\beta_k(l) = P\{Z_{k-1}^N \mid S_k = l, Z_l^k\}.$$

Firstly, the forward metric is evaluated recursively as follows:

$$\alpha_k(m) = P\{S_k = m, Z_1^k\} = \sum_l P\{S_{k-1} = l, S_k = j, Z_1^{k-1}, Z_k\} \quad \text{(eq 3)}$$

$$\alpha_k(m) = \sum_l P\{S_{k-1} = l, Z_1^{k-1}\} \cdot P\{S_k = j, Z_k \mid S_{k-1} = l, Z_1^{k-1}\}$$

$$\alpha_k(m) = \sum_l \alpha_{k-1}(l) \cdot \begin{matrix} P\{S_k = j \mid S_{k-1} = l\} \cdot \\ P\{Z_k \mid S_k = j, S_{k-1} = l, Z_1^{k-1}\} \end{matrix}.$$

If it is possible to compute the last term, then the forward metrics ($\alpha$) can be calculated recursively.

Similarly, the backward metrics ($\beta$) can also be calculated recursively as shown below $$\beta_k(l) = P\{Z_{k+1}^N \mid S_k = l, S_{k-1} = j, Z_1^k\} \quad \text{(eq 4)}$$

$$= \sum_j P\{S_{k+1} = j, Z_{k+1}^N \mid S_k = l, Z_1^N\}$$

$$\beta_k(l) = \beta_{k+1}(j) \cdot P\{S_{k+1} = j \mid S_k = l\} \cdot$$

$$= P\{Z_{k+1} \mid S_{k+1} = l, S_k = j, Z_1^k\}.$$

If the value, v+1, is the memory of the communication channel, then the term, $P\{Z_{k+1} \mid S_{k+1} = l, S_k = j, Z_1^k\}$, which is the last term of the (eq 3) and the (eq 4) can be expressed as follows:

$$P\{Z_{k+1} \mid S_{k+1} = l, S_k = j, Z_1^k\} = P\{Z_{k+1} \mid a_{k+1}, a_k, a_{k-1} a_{k-\nu}, Z_1^k\}$$

$$P\{Z_{k+1} \mid S_{k+1} = l, S_k = j, Z_1^k\} = P\{n_{k+1} \mid a_{k+1}, a_k, a_{k-1} a_{k-\nu}, n_{k-\nu}^k\}$$

Since the value, v+1, is typically greater than L, it is possible to simplify the term, $P\{n_{k+1} \mid a_{k+1}, a_k, a_{k-1} a_{k-\nu}, n_{k-\nu}^k\}$, as follows:

$$P\{n_{k+1} \mid a_{k+1}, a_k, a_{k-1} a_{k-\nu}, n_{k-\nu}^k\} = P\left\{n_{k+1} = \sum_{i=1}^{L} \begin{matrix} b_i(a_{k+1-i}^{k+1}) n_{k+1-i} + \\ \sigma(a_{k+1-i}^{k+1}) w_{k+1} \end{matrix} \,\middle|\, a_{k+1}, a_k, a_{k-1} a_{k-\nu}, n_{k-\nu}^k\right\}$$

$$= P\left\{w_{k+1} = n_{k+1} - \sum_{i=1}^{L} b_i(a_{k+1-i}^{k+1}) n_{k+1-i} / \sigma(a_{k+1-i}^{k+1})\right\}$$

This term can be computed per branch using the statistics of $\{w_k\}$. This shows how the symbol by symbol MAP approach can be implemented using forward and backward recursions to calculate the forward metrics ($\alpha$) and backward metrics ($\beta$), and subsequently the LLRs corresponding thereto. This shows how soft information can be calculated using recursion. This soft information, as calculated using a detector or as calculated within a corresponding detection method, can then be provided to a detector that is operable to perform iterative error correction decoding processing.

Figure 13:
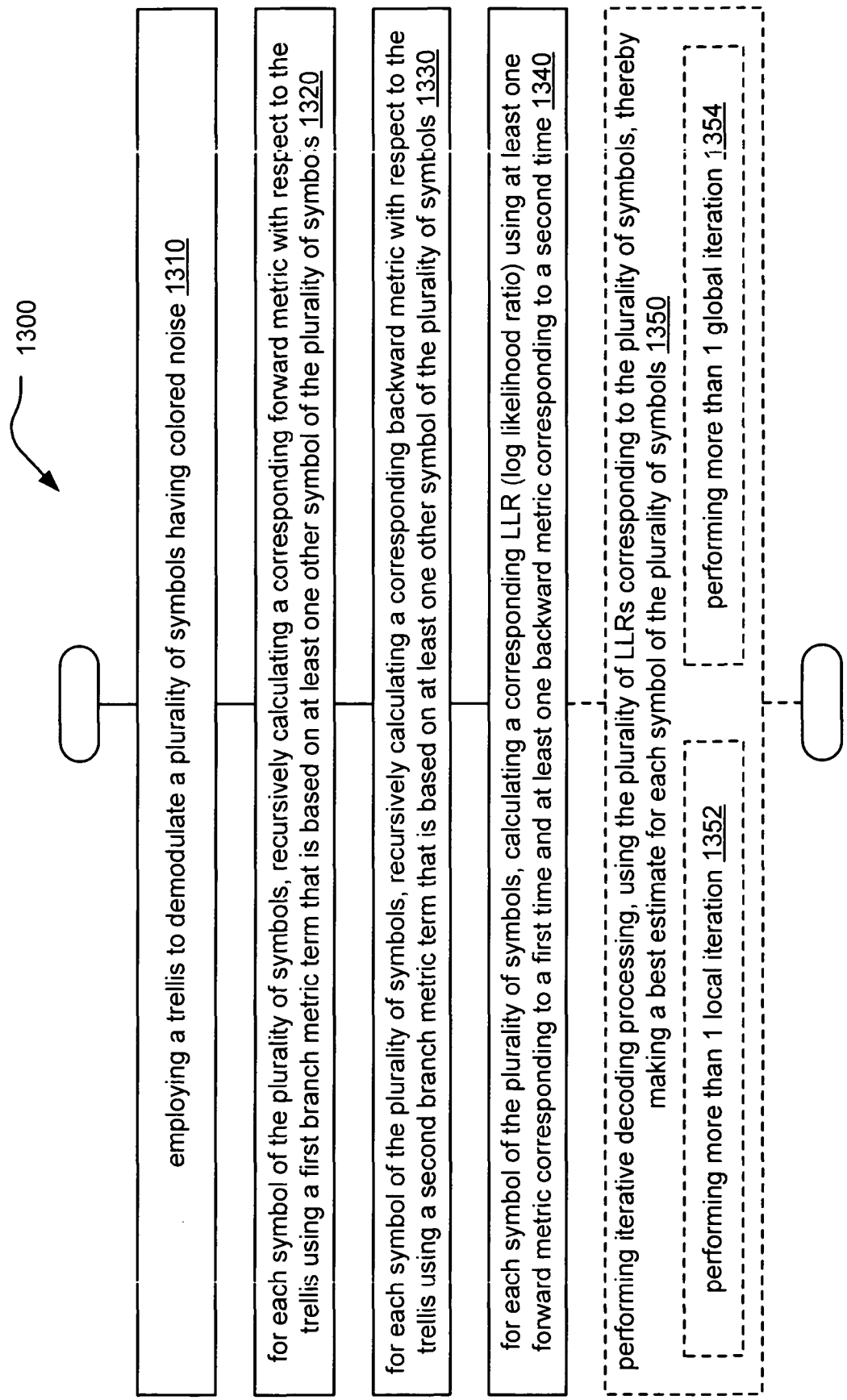
FIG. 13 illustrates an embodiment of a method for performing soft information calculation.

FIG. 13 illustrates an embodiment of a method 1300 for performing soft information calculation. As shown in a block 1310, the method 1300 involves employing a trellis to demodulate a plurality of symbols having colored noise.

For each symbol of the plurality of symbols, the method 1300 then involves recursively calculating a corresponding forward metric with respect to the trellis using a first branch metric term that is based on at least one other symbol of the plurality of symbols, as shown in a block 1320. For each symbol of the plurality of symbols, as shown in a block 1330, the method 1300 involves recursively calculating a corresponding backward metric with respect to the trellis using a second branch metric term that is based on at least one other symbol of the plurality of symbols.

For each symbol of the plurality of symbols, the method 1300 then involves calculating a corresponding LLR (log likelihood ratio) using at least one forward metric corresponding to a first time and at least one backward metric corresponding to a second time as shown in a block 1340.

As shown in a block 1350, the method 1300 involves performing iterative decoding processing, using the plurality of LLRs corresponding to the plurality of symbols, thereby making a best estimate for each symbol of the plurality of symbols. If desired, the iterative decoding processing within the block 1350 can involve performing more than 1 local iteration, as shown in a block 1352, and/or performing more than 1 global iteration, as shown in a block 1354.

Figure 14:
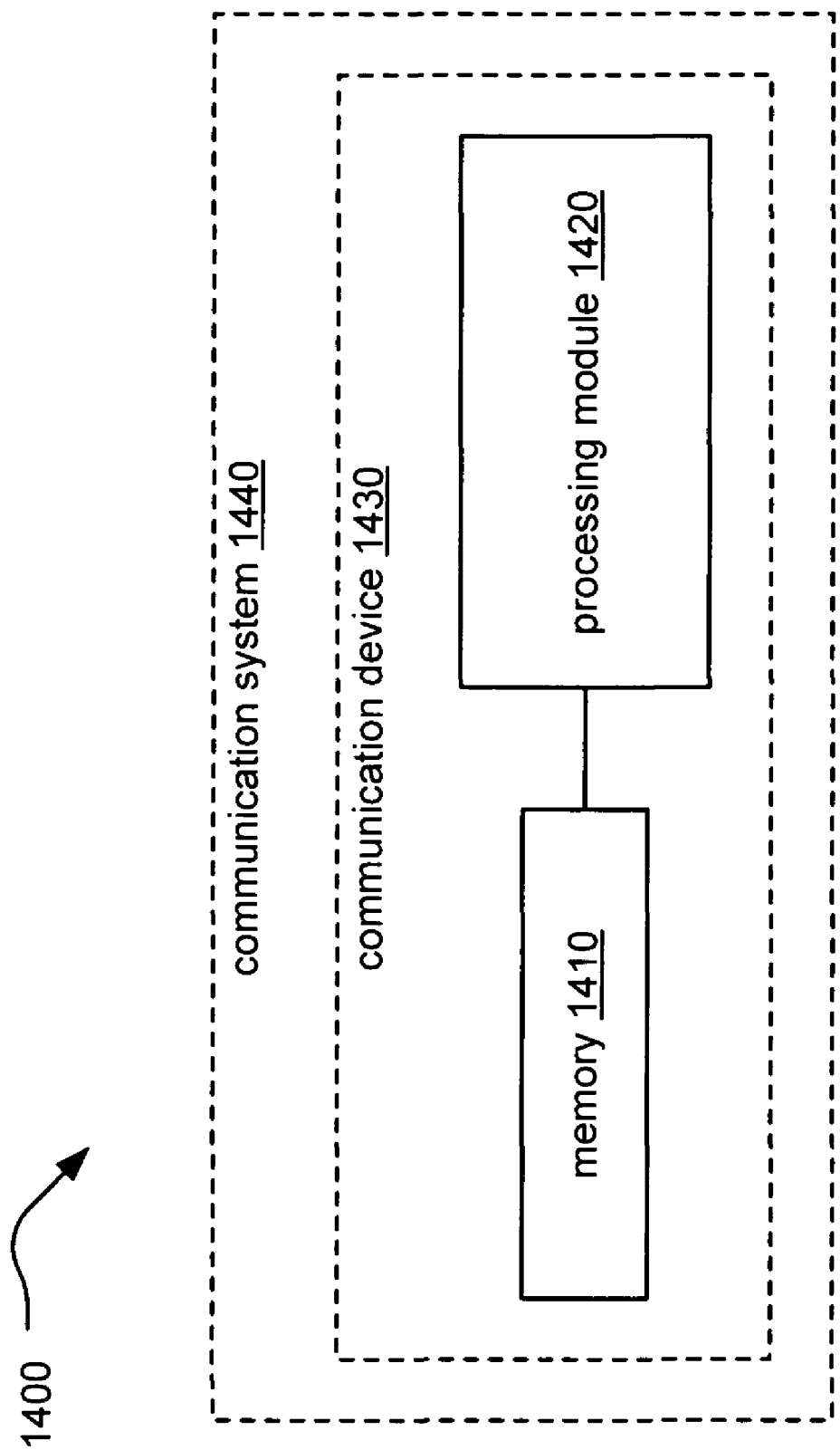
FIG. 14 is a diagram illustrating an embodiment of an apparatus that is operable to perform soft information calculation.

FIG. 14 is a diagram illustrating an embodiment of an apparatus 1400 that is operable to perform soft information calculation. The apparatus 1400 includes a processing module 1420, and a memory 1410. The memory 1410 is coupled to the processing module, and the memory 1410 is operable to store operational instructions that enable the processing module 1420 to perform a variety of functions. The processing module 1420 (serviced by the memory 1420) can be implemented as an apparatus capable to perform any of the functionality of any of the various modules and/or functional blocks described herein. For example, the processing module 1420 (serviced by the memory 1420) can be implemented as an apparatus capable to perform soft information calculation in accordance with any of the various embodiments described above.

The processing module 1420 can be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions. The memory 1410 may be a single memory device or a plurality of memory devices. Such a memory device may be a read-only memory, random access memory, volatile memory, non-volatile memory, static memory, dynamic memory, flash memory, and/or any device that stores digital information. Note that when the processing module 1420 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

If desired in some embodiments, the apparatus 1400 can be any of a variety of communication devices 1430, or any part or portion of any such communication device 1430. Any such communication device that includes the apparatus 1400 can be implemented within any of a variety of communication systems 1440 as well.

Figure 15:
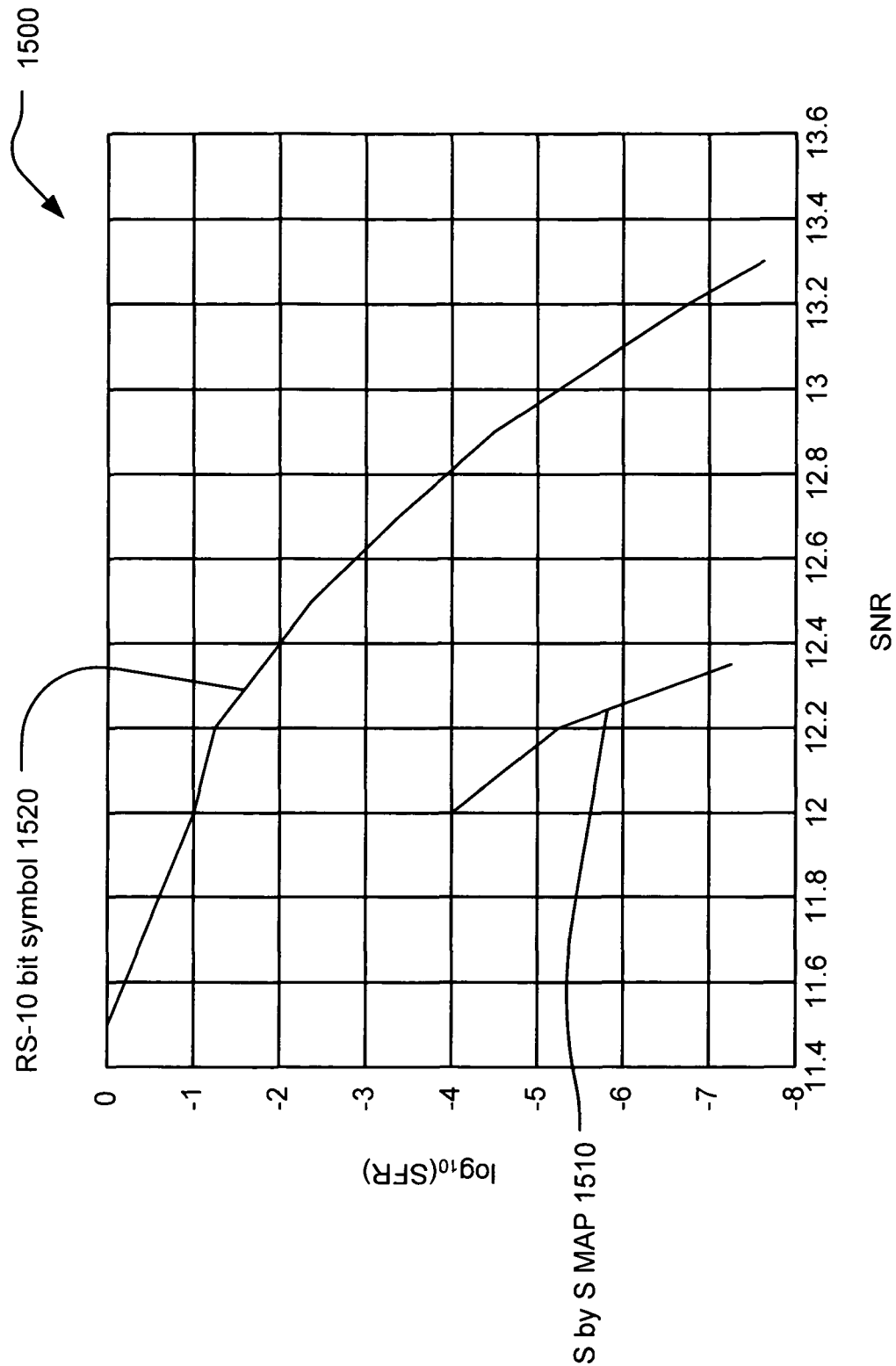
FIG. 15 illustrates an embodiment of a performance comparison of two different decoding approaches.

FIG. 15 illustrates an embodiment of a performance comparison 1500 of two different decoding approaches. This diagram shows simulation results for a communication channel corresponding to a perpendicular recording channel of a hard disk drive (HDD) that has correlated noise. The soft information calculation approach described above is used to generate the LLRs which are then input to an LDPC decoder. Only one global iteration is performed, and a maximum of 15 local iterations are performed for the LDPC decoder. The Sector Failure Rate (SFR) plots show that coding gain of 0.85 dB is obtained from the iterative decoder approach (shown as S by S MAP 1510) when compared to the performance of an embodiment of a hard decision Reed-Solomon (RS) decoder (shown as RS-10 bit symbol 1520).

It is also noted that the methods described within the preceding figures may also be performed within any appropriate system and/or apparatus designs (e.g., communication systems, communication devices, communication transmitters, communication receivers, communication transceivers, and/or functionality described) without departing from the scope and spirit of the invention.

In view of the above detailed description of the invention and associated drawings, other modifications and variations will now become apparent. It should also be apparent that such other modifications and variations may be effected without departing from the spirit and scope of the invention.

What is claimed is:

1. An apparatus, comprising:
a processing module; and
a memory, coupled to the processing module, that is operable to store operational instructions that enable the processing module to employ a trellis to demodulate a plurality of symbols having colored and signal-dependent noise and for each of the plurality of symbols:
recursively calculate a corresponding forward metric with respect to the trellis using a first branch metric term based on at least one other symbol of the plurality of symbols;
recursively calculate a corresponding backward metric with respect to the trellis using a second branch metric term that is based on at least one other symbol of the plurality of symbols; and
calculate a corresponding LLR (log likelihood ratio) by multiplying at least one forward metric corresponding to a first time, at least one backward metric corresponding to a second time, and at least one probability; and wherein:
the plurality of symbols having colored and signal-dependent noise generated by processing a signal, having been perpendicularly recorded, received from a read channel coupled to a storage media of a hard disk drive (HDD); and
the at least one probability being a product of a plurality of terms including a first term being a duplicate of the at least one forward metric, a second term being a duplicate of the at least one backward metric, and a third term being "a priori" probability of input information bits within the signal corresponding to transition via the trellis from a first state at the first time to a second state at the second time.

2. The apparatus of claim 1, wherein:
at least one symbol of the plurality of symbols includes only one bit.

3. The apparatus of claim 1, wherein:
the signal is an LDPC (Low Density Parity Check) coded signal.

4. The apparatus of claim 1, wherein:
the HDD is implemented within at least one of a handheld audio unit, a computer, a wireless communication device, and a personal digital assistant (PDA).

5. The apparatus of claim 1, further comprising:
an iterative decoder that is operable to:
  receive a plurality of LLRs corresponding to the plurality of symbols; and
  perform iterative decoding processing thereby making a plurality of best estimates corresponding to the plurality of symbols such that each one of the plurality of best estimates corresponds to a respective one of the plurality of symbols.

6. The apparatus of claim 5, wherein:
the iterative decoder performs a plurality of local decoding iterations to generate the plurality of best estimates;
the iterative decoder feeds back the plurality of best estimates to the processing module as "a priori" information for use during a global decoding iteration;
the memory, coupled to the processing module, is operable to store operational instructions that enable the processing module to calculate at least one additional corresponding LLR using at least one additional forward metric corresponding to the first time and at least one additional backward metric corresponding to the second time for each symbol of the plurality of symbols; and
the iterative decoder is operable to:
  receive the at least one additional plurality of LLRs corresponding to the plurality of symbols; and
  perform iterative decoding processing thereby making at least one additional best estimate for each symbol of the plurality of symbols.

7. The apparatus of claim 5, wherein:
the plurality of symbols having colored and signal-dependent noise is generated by processing the signal;
the signal is an LDPC (Low Density Parity Check) coded signal; and
the iterative decoder is an LDPC code decoder.

8. The apparatus of claim 5, wherein:
the plurality of symbols having colored and signal-dependent noise is generated by processing the signal;
the signal is a turbo coded signal; and
the iterative decoder is a turbo code decoder.

9. An apparatus, comprising:
a detector that is operable to employ a trellis to demodulate a plurality of symbols having colored and signal-dependent noise and for each symbol of the plurality of symbols:
  recursively calculate a corresponding forward metric with respect to the trellis;
  recursively calculate a corresponding backward metric with respect to the trellis; and
  calculate a corresponding LLR (log likelihood ratio) by multiplying at least one forward metric corresponding to a first time, at least one backward metric corresponding to a second time, and at least one probability generated by multiplying a plurality of product terms; and
an iterative decoder that is operable to:
  receive, from the decoder, a plurality of LLRs corresponding to the plurality of symbols; and
  perform iterative decoding processing thereby making a plurality of best estimates corresponding to the plurality of symbols such that each one of the plurality of best estimates corresponds to a respective one of the plurality of symbols; and wherein:
the plurality of symbols having colored and signal-dependent noise is generated by processing a signal, having been perpendicularly recorded, that is received from a read channel that is coupled to a storage media of a hard disk drive (HDD); and
the at least one probability being a product of a plurality of terms including a first term being a duplicate of the at least one forward metric, a second term being a duplicate of the at least one backward metric, and a third term being "a priori" probability of input information bits within the signal corresponding to transition via the trellis from a first state at the first time to a second state at the second time.

10. The apparatus of claim 9, wherein:
the detector is operable to:
  for each symbol of the plurality of symbols, recursively calculate the corresponding forward metric with respect to the trellis using a first branch metric term that is based on at least one other symbol of the plurality of symbols; and
  for each symbol of the plurality of symbols, recursively calculate the corresponding backward metric with respect to the trellis using a second branch metric term that is based on at least one other symbol of the plurality of symbols.

11. The apparatus of claim 9, further comprising:
an AFE (analog front-end) analog that is operable to receive the signal;
an ADC (analog to digital converter) that is operable to sample the signal thereby generating a discrete-time signal; and
a digital equalizer that is operable to perform equalization on the discrete-time signal thereby generating the plurality of symbols having colored and signal-dependent noise.

12. The apparatus of claim 9, wherein:
the iterative decoder performs a plurality of local decoding iterations to generate the plurality of best estimates;
the iterative decoder feeds back the plurality of best estimates to the detector as "a priori" information for use during a global decoding iteration;
for each symbol of the plurality of symbols, the detector is operable to calculate at least one additional corresponding LLR using at least one additional forward metric corresponding to the first time and at least one additional backward metric corresponding to the second time; and
the iterative decoder is operable to:
  receive the at least one additional plurality of LLRs corresponding to the plurality of symbols; and
  perform iterative decoding processing thereby making at least one additional best estimate for each symbol of the plurality of symbols.

13. The apparatus of claim 9, wherein:
the signal is an LDPC (Low Density Parity Check) coded signal; and
the iterative decoder is an LDPC code decoder.

14. The apparatus of claim 9, wherein:
the signal is a turbo coded signal; and
the iterative decoder is a turbo code decoder.

15. The apparatus of claim 9, wherein:
at least one symbol of the plurality of symbols includes only one bit.

16. The apparatus of claim 9, wherein:
the HDD is implemented within at least one of a handheld audio unit, a computer, a wireless communication device, and a personal digital assistant (PDA).

17. A method, comprising:
processing a signal, having been perpendicularly recorded, that is received from a communication channel to generate a plurality of symbols having colored and signal-dependent noise, wherein the communication channel is a read channel that is coupled to a storage media of a hard disk drive (HDD);
employing a trellis to demodulate the plurality of symbols having colored and signal-dependent noise;
for each symbol of the plurality of symbols, recursively calculating a corresponding forward metric with respect to the trellis using a first branch metric term that is based on at least one other symbol of the plurality of symbols;
for each symbol of the plurality of symbols, recursively calculating a corresponding backward metric with respect to the trellis using a second branch metric term that is based on at least one other symbol of the plurality of symbols; and
for each symbol of the plurality of symbols, calculating a corresponding LLR (log likelihood ratio) by multiplying at least one forward metric corresponding to a first time, at least one backward metric corresponding to a second time, and at least one probability; and wherein:
the at least one probability being a product of a plurality of terms including a first term being a duplicate of the at least one forward metric, a second term being a duplicate of the at least one backward metric, and a third term being "a priori" probability of input information bits within the signal corresponding to transition via the trellis from a first state at the first time to a second state at the second time.

18. The method of claim 17, further comprising:
performing iterative decoding processing, using a plurality of LLRs corresponding to the plurality of symbols, thereby making a plurality of best estimates corresponding to the plurality of symbols such that each one of the plurality of best estimates corresponds to a respective one of the plurality of symbols.

19. The method of claim 17, further comprising:
performing a first plurality of local decoding iterations, such that at least one local decoding iteration thereof uses a plurality of LLRs corresponding to the plurality of symbols, thereby making a plurality of best estimates corresponding to the plurality of symbols such that each of the plurality of best estimates corresponds to a respective one of the plurality of symbols;
feeding back the plurality of best estimates, as "a priori" information for use during a global decoding iteration;
for each symbol of the plurality of symbols, calculating at least one additional corresponding LLR using at least one additional forward metric corresponding to the first time and at least one additional backward metric corresponding to the second time; and
performing a second plurality of local decoding iterations, such that at least one local decoding iteration thereof uses the at least one additional plurality of LLRs corresponding to the plurality of symbols, thereby making at least one additional best estimate for each symbol of the plurality of symbols.

20. The method of claim 17, further comprising:
the HDD is implemented within at least one of a handheld audio unit, a computer, a wireless communication device, and a personal digital assistant (PDA).

* * * * *

UNITED STATES PATENT AND TRADEMARK OFFICE
CERTIFICATE OF CORRECTION

PATENT NO. : 8,091,009 B2  
APPLICATION NO. : 11/438464  
DATED : January 3, 2012  
INVENTOR(S) : Ravi Motwani Page 1 of 1

It is certified that error appears in the above-identified patent and that said Letters Patent is hereby corrected as shown below:

Col. 20, line 2, in claim 9: delete "generated by multiplying a plurality of product terms"

Signed and Sealed this
Twelfth Day of March, 2013

Teresa Stanek Rea
*Acting Director of the United States Patent and Trademark Office*